(12) United States Patent  
Maekawa

(10) Patent No.: US 10,446,211 B2  
(45) Date of Patent: Oct. 15, 2019

(54) SEMICONDUCTOR STORAGE DEVICE

(71) Applicant: TOSHIBA MEMORY CORPORATION, Tokyo (JP)

(72) Inventor: Hiroaki Maekawa, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/907,894

(22) Filed: Feb. 28, 2018

(65) Prior Publication Data

US 2019/0088301 A1    Mar. 21, 2019

(30) Foreign Application Priority Data

Sep. 20, 2017    (JP) .................................. 2017-180342

(51) Int. Cl.
| | |
|---|---|
| *G11C 11/16* | (2006.01) |
| *H01L 27/22* | (2006.01) |
| *H01L 43/08* | (2006.01) |
| *H01L 25/065* | (2006.01) |
| *G11C 11/00* | (2006.01) |
| *G11C 13/00* | (2006.01) |
| *H01L 43/10* | (2006.01) |

(52) U.S. Cl.
CPC ........ *G11C 11/1675* (2013.01); *G11C 11/005* (2013.01); *G11C 11/161* (2013.01); *G11C 11/1673* (2013.01); *G11C 11/1693* (2013.01); *G11C 13/0033* (2013.01); *G11C 13/0035* (2013.01); *G11C 13/0061* (2013.01); *G11C 13/0069* (2013.01); *H01L 25/0657* (2013.01); *H01L 27/228* (2013.01); *H01L 43/08* (2013.01); *G11C 13/004* (2013.01); *H01L 43/10* (2013.01)

(58) Field of Classification Search
CPC .............. G11C 11/1675; G11C 11/161; G11C 11/1673; H01L 25/0657; H01L 43/08; H01L 27/228; H01L 43/10
USPC ........................................................ 365/158
See application file for complete search history.

(56) References Cited

U.S. PATENT DOCUMENTS

| | | |
|---|---|---|
| 6,947,318 B1 | 9/2005 | Fujita |
| 9,437,272 B1 | 9/2016 | Lu et al. |
| 2015/0302911 A1* | 10/2015 | Lombard ................ G11C 11/16 365/158 |

(Continued)

FOREIGN PATENT DOCUMENTS

| | | |
|---|---|---|
| JP | 2004118921 A | 4/2004 |
| JP | 2008218649 A | 9/2008 |

(Continued)

*Primary Examiner* — Fernando Hidalgo  
(74) *Attorney, Agent, or Firm* — Kim & Stewart LLP

(57) ABSTRACT

A semiconductor storage device includes a plurality of first memory elements in a first region and a plurality of second memory elements in a second region. The second memory elements each have a physical volume that is greater than a physical volume of the first memory elements. A controller is configured to first write data to the plurality of first memory elements and then transfer the data written to plurality of first memory elements to the plurality of second memory elements when at least one of an elapsed time since initial writing or a data reading frequency exceeds a threshold value. In general, the first memory elements and the second memory elements are variable resistance elements.

19 Claims, 15 Drawing Sheets

(56) References Cited

U.S. PATENT DOCUMENTS

2016/0172044 A1* 6/2016 Lu ...................... G11C 16/0466
                                                          365/185.11
2016/0203854 A1* 7/2016 Kim .................. G11C 11/40626
                                                          365/222
2017/0062701 A1* 3/2017 Annunziata ............. H01L 43/08

FOREIGN PATENT DOCUMENTS

| JP | 205058745 A | 3/2015 | |
|----|----|----|----|
| WO | 2008108264 A1 | 9/2008 | |
| WO | WO-2008108264 A1 * | 9/2008 | ............. B82Y 10/00 |

* cited by examiner

SEMICONDUCTOR STORAGE DEVICE

CROSS-REFERENCE TO RELATED APPLICATION

This application is based upon and claims the benefit of priority from Japanese Patent Application No. 2017-180342, filed Sep. 20, 2017, the entire contents of which are incorporated herein by reference.

FIELD

Embodiments described herein relate generally to a semiconductor storage device.

BACKGROUND

A magnetic random access memory (MRAM) is a memory device in which a magnetoresistive effect is used for storing information in a memory cell having a magnetic element. MRAM devices have been attracting attention as next-generation memory devices having high-speed operation, large capacity, and non-volatility. In addition, MRAM devices have been investigated as possible substitutes for volatile memory devices such as dynamic random access memory (DRAM) and static random access memory (SRAM). The MRAM having substantially the same specifications as DRAM or SRAM may be developed in order to smoothly substitute MRAM for DRAM or SRAM in existing device designs to reduce costs required for the development.

DETAILED DESCRIPTION

Figure 1:
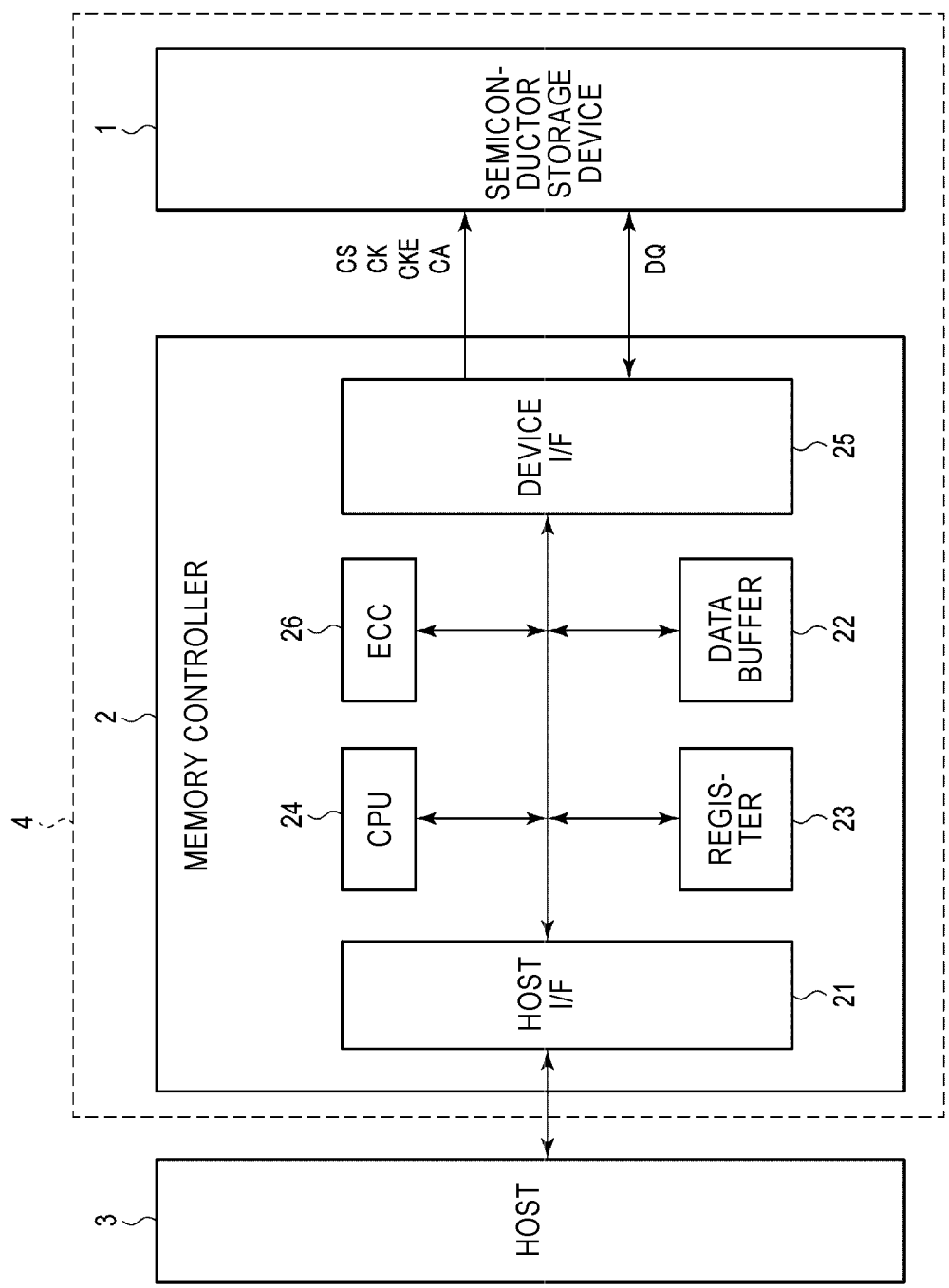
FIG. 1 is a block diagram illustrating a basic configuration of a memory system including a semiconductor storage device according to a first embodiment.

According to one embodiment, a semiconductor storage device comprises a plurality of first memory elements in a first region and a plurality of second memory elements in a second region. The individual second memory elements each have a physical volume that is greater than a physical volume of the individual first memory elements. A controller is configured to first write data to the plurality of first memory elements and then transfer the data written to plurality of first memory elements to the plurality of second memory elements when at least one of an elapsed time since initial writing or a data reading frequency exceeds a threshold value. In general, the first memory elements and the second memory elements are variable resistance elements.

Hereinafter, example embodiments will be described with reference to the drawings. Further, in the following description, elements having substantially the same functions and configurations will be denoted by the same reference numerals.

It should be noted that the drawings are schematic, and any depicted relationship between a thickness and or other dimension, ratios of thicknesses of respective layers, and the like are generally different from those in actual devices unless otherwise indicated. The different drawings include parts which are illustrated with different dimensional relationships and ratios for purposes of explanation.

In addition, in the present specification, an X-Y-Z orthogonal coordinate system will be used for the convenience of description. In this coordinate system, two directions, which are in parallel with the upper surface of a semiconductor substrate and orthogonal to each other, are defined as an X direction (D1) and a Y direction (D2), and a direction, which is orthogonal to both of the X direction and the Y direction, that is, a direction along which the respective layers are stacked is defined as a Z direction (D3).

<1> First Embodiment
<1-1> Configuration
<1-1-1> Configuration of Memory System

A basic configuration of a memory system including a semiconductor storage device according to a first embodiment will be schematically described with reference to FIG. 1. The memory system 4 includes a semiconductor storage device 1 and a memory controller 2.

<1-1-2> Configuration of Memory Controller

The memory controller 2 receives a command from a host 3, such as a personal computer or other external equipment, and reads data from the semiconductor storage device 1 or writes data to the semiconductor storage device 1.

The memory controller 2 includes a host interface (I/F) 21, a data buffer 22, a register 23, a CPU 24, a device interface (I/F) 25, and an error correction coding (ECC) circuit 26.

The host interface 21 is connected to the host 3. Transmission and reception of data are performed between the host 3 and the memory system 4 through the host interface 21.

The data buffer 22 is connected to the host interface 21. The data buffer 22 receives data transmitted to the memory system 4 from the host 3 through the host interface 21, and temporarily stores the data. In addition, the data buffer 22 temporarily stores the data to be transmitted to the host 3 from the memory system 4 through the host interface 21. The data buffer 22 may be a volatile memory or a nonvolatile memory.

For example, the register 23 is a volatile memory and stores setting information, commands, and statuses, which used by the CPU 24 during execution of various operations/functions. The register 23 may be a volatile memory or a nonvolatile memory.

The CPU 24 controls the operation of the memory system 4. For example, the CPU 24 performs a predetermined process on the semiconductor storage device 1 in accordance with a command received from the host 3.

The device interface 25 performs transmission and reception of various types of signals and the like between the memory controller 2 and the semiconductor storage device 1.

The ECC circuit 26 receives, through the data buffer 22, write data received from the host 3. Further, the ECC circuit 26 adds an error correction code to the write data. For example, the ECC circuit 26 supplies the data buffer 22 or the device interface 25 with write data to which an error correction code has been added.

In addition, the ECC circuit 26 receives the data supplied from the semiconductor storage device 1 through the device interface 25. The ECC circuit 26 determines whether an error is present in the data received from the semiconductor storage device 1. When the ECC circuit 26 determines that an error is present in the received data, the ECC circuit 26 corrects the error of the received data using the error correction code. Further, the ECC circuit 26 supplies error-corrected data to the data buffer 22, the device interface 25, and the like.

<1-1-3> Semiconductor Storage Device

A basic configuration of the semiconductor storage device according to the first embodiment will be schematically described with reference to FIG. 2.

The semiconductor storage device 1 according to the first embodiment includes a peripheral circuit 10 and a memory region 11.

Figure 2:
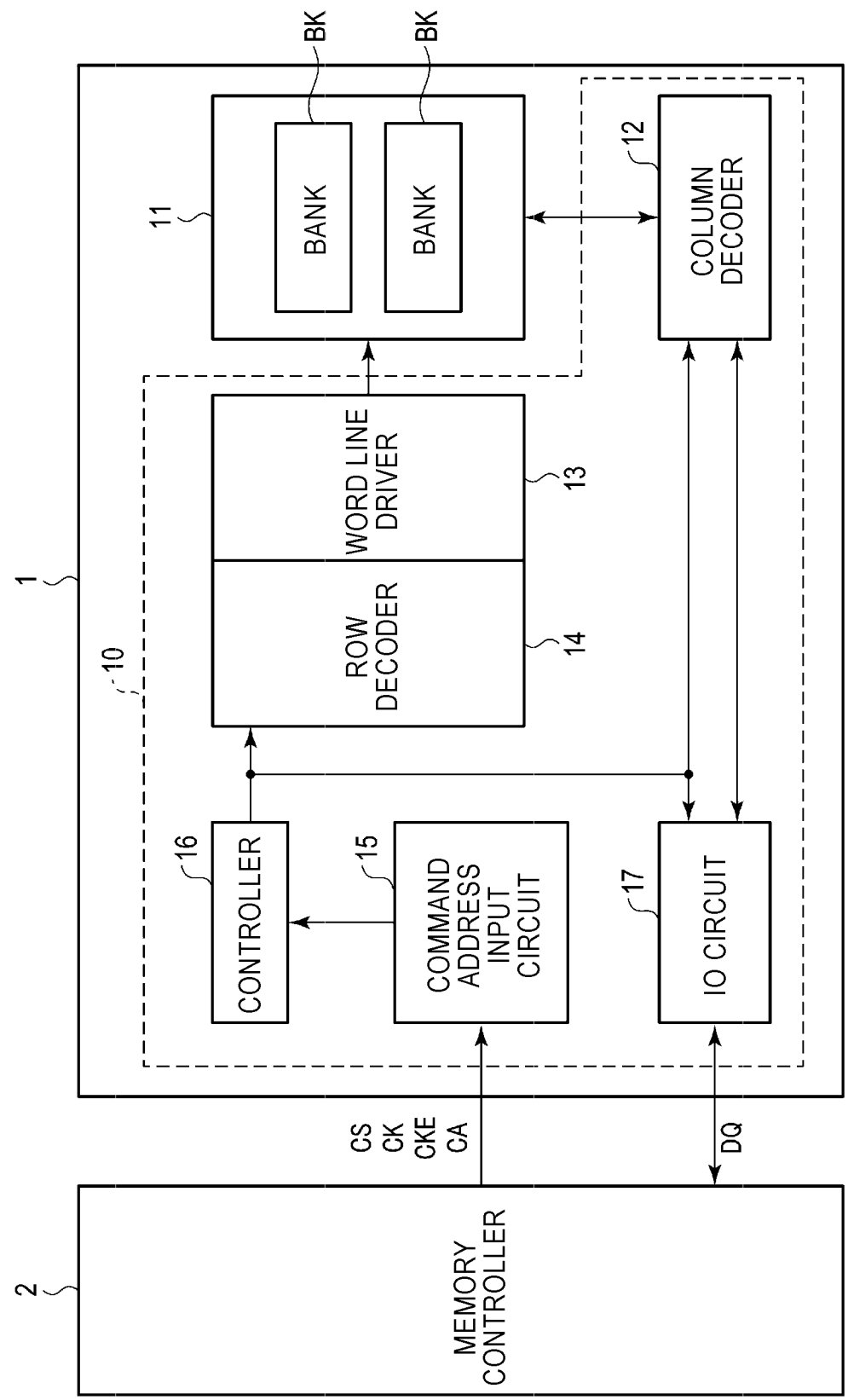
FIG. 2 is a block diagram illustrating the basic configuration of the semiconductor storage device according to the first embodiment.

The memory region 11 includes multiple banks BK (two banks BK in the particular example illustrated in FIG. 2). For example, the banks BK may be independently activated. The banks BK will be described further below.

The peripheral circuit 10 includes a column decoder 12, a word line driver 13, a row decoder 14, a command address input circuit 15, a controller 16, and an IO circuit 17.

Based on an external control signal, the column decoder 12 recognizes a command or an address according to a command address signal CA, and controls selection of a bit line BL and a source line SL.

The word line driver 13 is disposed along at least one side of the bank BK. In addition, the word line driver 13 is configured to apply voltage to a selected word line WL through a main word line MWL when reading or writing data.

The row decoder 14 decodes the address of the command address signal CA supplied from the command address input circuit 15. More specifically, the row decoder 14 supplies the decoded row address to the word line driver 13. Thereby, the word line driver 13 may apply voltage to the selected word line WL.

Various types of external control signals, for example, a chip select signal CS, a clock signal CK, a clock enable signal CKE, the command address signal CA, and the like are input to the command address input circuit 15 from the memory controller 2. The command address input circuit 15 transmits the command address signal CA to the controller 16.

The controller 16 identifies the command and the address. The controller 16 controls the semiconductor storage device 1.

The IO circuit 17 temporarily stores data (input data) input from the memory controller 2 through a data line DQ, or data (output data) read from the selected bank. The input data is written in a memory cell of the selected bank.

<1-1-4> Bank BK

Figure 3:
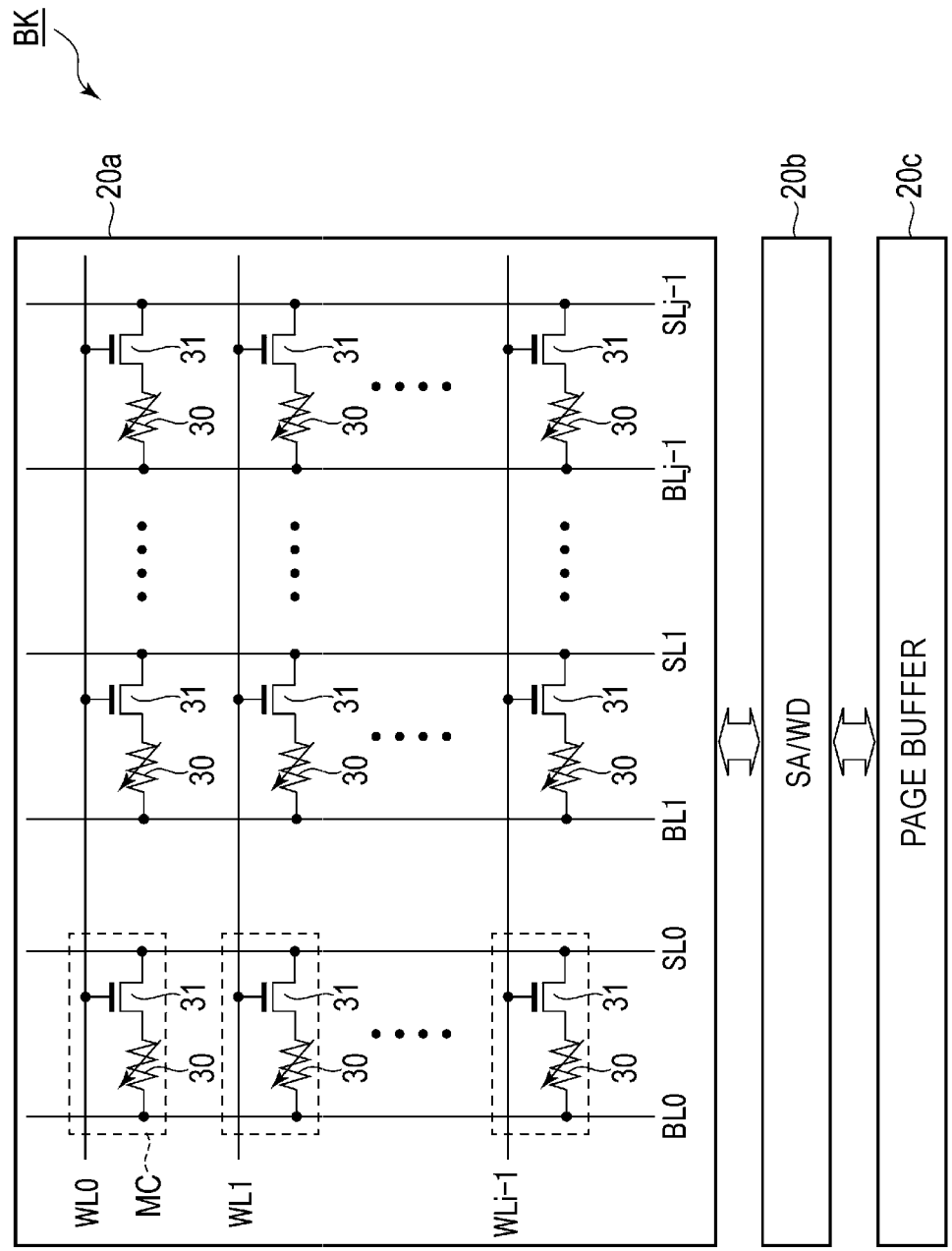
FIG. 3 is a block diagram illustrating a basic configuration of a bank of the semiconductor storage device according to the first embodiment.

A basic configuration of a bank BK in the semiconductor storage device according to the first embodiment will be schematically described with reference to FIG. 3.

The bank BK includes a memory array 20a, a sense amplifier/write driver (SA/WD) 20b, and a page buffer 20c.

The multiple memory cells MC are arranged in a matrix form, thereby configuring the memory array 20a. In the memory array 20a, multiple word lines WL0 to WLi-1 (where i is an integer equal to or greater than 2), multiple bit lines BL0 to BLj-1 (where j is an integer equal to or greater than 2), and multiple source lines SL0 to SLj-1 are disposed. Each row of the memory array 20a is connected to one corresponding word line WL, and each column of the memory array 20a is connected to a pair of lines including one bit line BL and one source line SL.

The memory cell MC is configured with a magnetoresistive effect element 30 and a selection transistor 31. The magnetoresistive effect element 30 can be a magnetic tunnel junction (MTJ) element and maybe referred to as a MJT element 30 in some contexts. For example, the selection transistor 31 is an N-channel MOSFET.

One end of the MTJ element 30 is connected to the bit line BL, and the other end of the MTJ element 30 is connected to a drain/source of the selection transistor 31. A gate of the selection transistor 31 is connected to the word line WL, and the source/drain of the selection transistor 31 is connected to the source line SL.

The sense amplifier/write driver 20b is disposed in a bit line direction of the memory array 20a. The sense amplifier/write driver 20b includes a sense amplifier and a write driver. The data stored in the memory cells are read by detecting current flowing in a memory cell MC which is connected to the bit line BL through a global bit line GBL and connected to the selected word line WL through the main word line MWL. The write driver writes the data by causing current to flow to the memory cell MC, which is connected to the bit line BL through the global bit line GBL or connected to the source line SL through the global source line GSL, and connected to the selected word line WL through the main word line MWL. Further, the sense amplifier/write driver 20b controls the bit line BL and the source line SL selection based on a control signal from the controller 16. Data exchange between the sense amplifier/write driver 20b and the data line DQ is performed through the IO circuit 17.

The page buffer 20c temporarily holds the data read from the memory array 20a or the write data received from the memory controller 2. The writing of the data to the memory array 20a is performed in multiple memory cell units, referred to as a page or page unit. In addition, a page buffer 20c according to the first embodiment is provided for each bank BK, and has a storage capacity capable of temporarily storing data of at least one page of the bank BK.

In addition, the above-described configuration of the bank BK is an example, and the bank BK may have other configurations.

<1-1-5> Memory Cell MC
<1-1-5-1> Outline
<1-1-5-1-1> First Example

Figure 4:
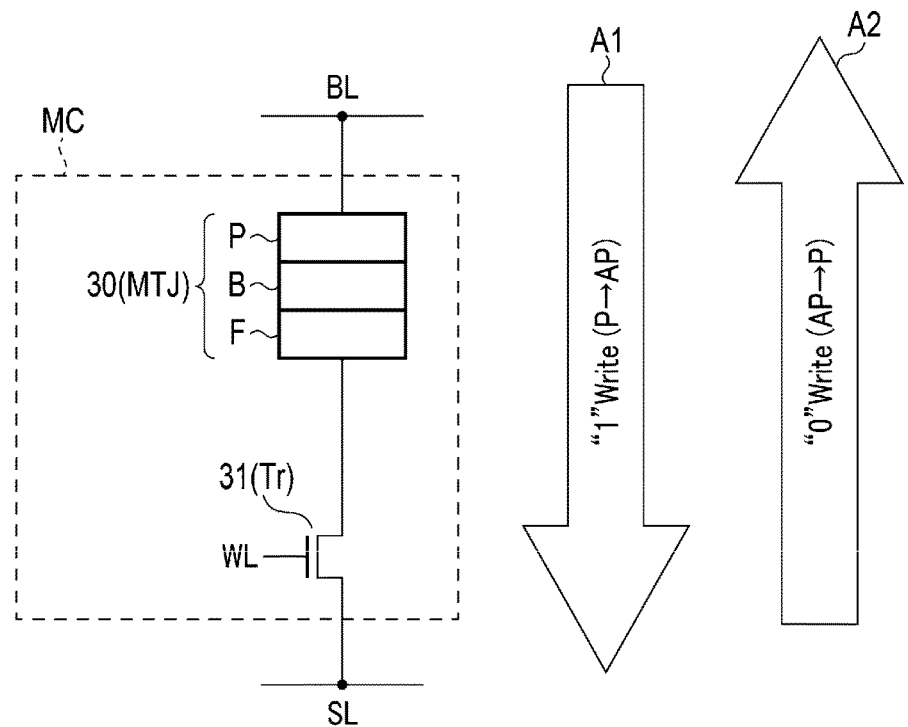
FIG. 4 is a block diagram illustrating a first example of a configuration of a memory cell of the semiconductor storage device according to the first embodiment.

Subsequently, a first example of the configuration of the memory cell MC of the semiconductor storage device according to the first embodiment will be schematically described with reference to FIG. 4. As illustrated in FIG. 4, one end of the MTJ element 30 is connected to a bit line BL, and the other end of the MTJ element 30 is connected to an end of a selection transistor 31. Further, the other end of the selection transistor 31 is connected to the source line SL. The MTJ element 30, which uses a tunneling magnetoresistive (TMR) effect, has a stacked structure (also referred to as a multi-layered structure) configured with a ferromagnetic layer F, ferromagnetic layer P, and a non-magnetic layer (tunnel insulating film) B interposed between the ferromagnetic layers F and P. The MTJ element 30 stores digital data in accordance with a change in resistance which is caused by a spin polarization tunnel effect. The MTJ element 30 may assume a low resistance state and a high resistance state by magnetization arrangements of the two ferromagnetic layers F and P. For example, assuming that the low resistance state is defined as data "0" and the high resistance state is defined as data "1", 1-bit data may be recorded on the MTJ element 30. Of course, the low resistance state may instead be defined as the data "1", and the high resistance state may instead be defined as the data "0".

For example, the MTJ element 30 is configured by sequentially stacking a storage layer (free layer, recording layer) F, a non-magnetic layer B, and a reference layer (pinned layer, fixed layer) P. The reference layer P and the storage layer F are ferromagnetic material, and the non-magnetic layer B is an insulating film (e.g., $Al_2O_3$ or MgO). The reference layer P is a layer having a fixed magnetization direction, and the storage layer F has a variable magnetization direction such that the storage layer F can change magnetization direction to store data in the MTJ element.

When current flows in the direction indicated by arrow A1 when writing data, the magnetization direction of the free layer F is brought into an anti-parallel state (AP state) with respect to the magnetization direction of the pinned layer P, and is brought into a high resistance state (data "1"). When current flows in the direction indicated by arrow A2 when writing data, the magnetization direction of each of the pinned layer P and the free layer F is brought into a parallel state (P state), and is brought into a low resistance state (data "0"). As described above, the MTJ element 30 may write data that vary in accordance with the direction in which the current flows. The description "the magnetization direction is variable" means that the magnetization direction varies with respect to a predetermined write current. In addition, the description "the magnetization direction is fixed" means that the magnetization direction does not vary with respect to the predetermined write current.

<1-1-5-1-2> Second Example

Figure 5:
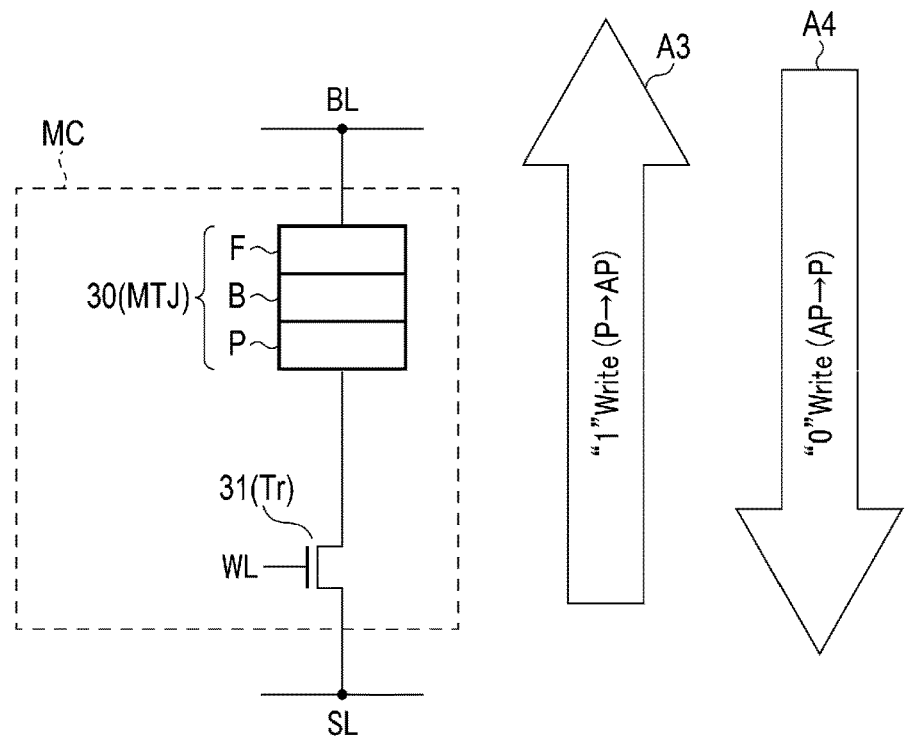
FIG. 5 is a block diagram illustrating a second example of the configuration of the memory cell of the semiconductor storage device according to the first embodiment.

Subsequently, a second example of the configuration of the memory cell MC of the semiconductor storage device according to the first embodiment will be schematically described with reference to FIG. 5. Hereinafter, differences from the first example will mainly be described. As illustrated in FIG. 5, in the second example, the MTJ element 30 is configured by sequentially stacking a reference layer (pinned layer, fixed layer) P, a non-magnetic layer B, and a storage layer (free layer, recording layer) F.

When current flows in the direction indicated by arrow A3 when writing data, the magnetization direction of the free layer F is brought into an anti-parallel state (AP state) with respect to the magnetization direction of the pinned layer P, and is brought into the high resistance state (data "1"). When current flows in the direction indicated by arrow A4 when writing data, the magnetization direction of each of the pinned layer P and the free layer F is brought into a parallel state (P state), and is brought into a low resistance state (data "0").

Hereinafter, the configuration of the memory cell MC will be described with respect to the semiconductor storage device based on the first example, but in general, each described embodiments can be implemented using the second example configuration instead of the first example configuration.

<1-1-5-2> Cross Section

Next, a cross section of the memory cell MC of the semiconductor storage device according to the first embodiment will be schematically described with reference to FIG. 6.

Figure 6:
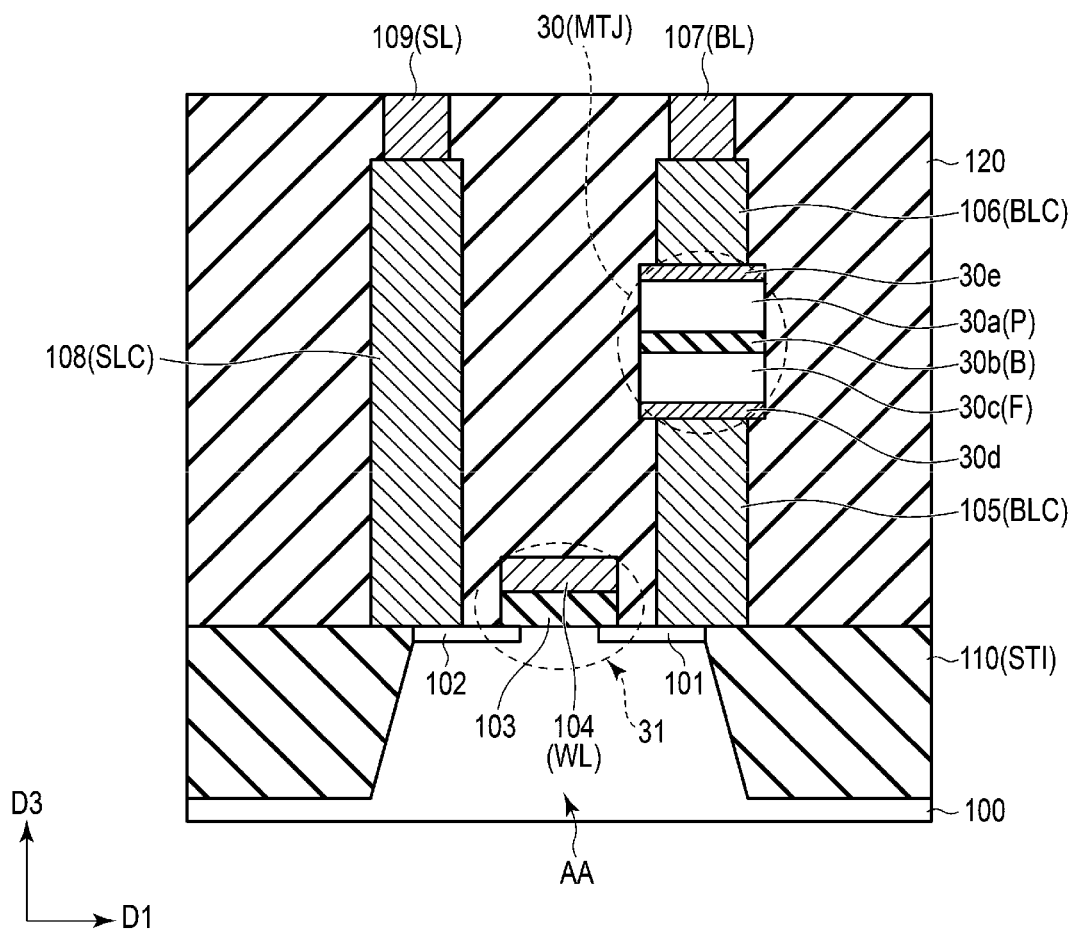
FIG. 6 is a cross-sectional view illustrating a cross section of the memory cell of the semiconductor storage device according to the first embodiment.

As illustrated in FIG. 6, an active area AA is defined by an element isolation area 110 formed on a semiconductor substrate 100. For example, the element isolation area 110 is configured with a silicon oxide film and may be referred to as a shallow trench isolation (STI) feature 110 or, for simplicity STI 110.

A source/drain diffusion region 101 and a source/drain diffusion region 102 are provided on the surface of the active area AA. A gate electrode 104 is provided on the surface of the active area AA between the source/drain diffusion region 101 and the source/drain diffusion region 102 with a gate insulating film 103 being interposed the gate electrode 104 and the surface of the active area AA. The gate electrode 104 is used as the word line WL. A stacked structure of the gate insulating film 103 and the gate electrode 104 provided on the active area AA functions as the selection transistor 31. In addition, the selection transistor 31 may have a structure in which the gate electrode 104 is embedded in a groove or recess in the active area AA via the gate insulating film 103.

The upper end of the MTJ element 30 is connected to a bit line (BL) 107 through a bit line contact (BLC) 106. In addition, the lower end of the MTJ element 30 is connected to the source/drain diffusion region 101 of the selection transistor 31 through the bit line contact (BLC) 105. The source/drain diffusion region 101 of the selection transistor 31 is connected to a source line (SL) 109 through a source line contact (SLC) 108. For example, the contact is made of aluminum (Al), tungsten (W), or the like. In addition, the bit line 107 and the source line 109 are made of, for example, copper (Cu), aluminum (Al), or the like.

The MTJ element 30 includes at least a reference layer 30a (ferromagnetic layer P), a non-magnetic layer 30b (insulating layer B), and a storage layer 30c (ferromagnetic layer F). The non-magnetic layer 30b is interposed between the fixed layer 30a and the storage layer 30c. A lower electrode 30d is provided on the lower side of the MTJ element 30. The lower electrode 30d electrically connects the storage layer 30c and a bit line contact 105 to each other. An upper electrode 30e is provided on the upper side of the MTJ element 30. The upper electrode 30e electrically connects the reference layer 30a and a bit line contact 106 to each other.

The reference layer 30a and the storage layer 30c are magnetic layers having orthogonal magnetic anisotropy. The magnetization direction of the reference layer 30a (P) and the storage layer 30c (F) is nearly perpendicular to a layer or film surface. The magnetization direction of the storage layer 30c (F) is variable, but the magnetization direction of the reference layer 30a (P) is substantially non-variable or fixed.

An artificial lattice made by stacking, for example, TbCoFe, Co, and Pt, a crystalline film made by regulating FePt to L10, or the like may be used for the reference layer 30a (P). In addition, by interposing CoFeB between the reference layer 30a (P) and the non-magnetic layer 30b (B), it is possible to improve polarizability of the reference layer 30a (P), and to obtain a high MR ratio (magnetoresistive ratio).

The non-magnetic layer 30b (B) is made of a non-magnetic material. A non-magnetic metal, a non-magnetic semiconductor, an insulator, or the like may be used for the non-magnetic layer 30b (B). For example, the non-magnetic layer 30b (B) may be made of MgO. When the non-magnetic layer 30b (B) is made of MgO, a high MR ratio may be obtained.

For example, the storage layer 30c (F) may be made of CoFeB as a magnetic material. The storage layer 30c may have a stacked structure including two or more layers. In this case, for example, the storage layer 30c may have a stacked structure including two magnetic layers, the main components of which are CoFeB or CoFe, and a non-magnetic metal layer interposed between the two magnetic layers.

The lower electrode 30d requires a material having low electrical resistance and high diffusion resistance. For example, a stacked film of Ta/Cu/Ta may be used as the lower electrode 30d.

The upper electrode 30e is also used as a mask for patterning the MTJ element 30 in manufacturing, in addition to functioning as an electrode in the final device. For this reason, the upper electrode 30e requires a material having low electrical resistance and high diffusion resistance, and also providing excellent etching or milling resistance. For example, a stacked film of Ta/Ru is used for the upper electrode 30e.

In addition, a shift cancel layer may be disposed between the upper electrode 30e and the reference layer 30a. The shift cancel layer is a layer for adjusting a magnetic field that otherwise leaks from the reference layer 30a to the storage layer 30c. With the shift cancel layer, the information held by the storage layer 30c can be more stably held.

In addition, as depicted the MTJ element 30 is provided immediately on the bit line contact 105, but the MTJ element 30 may be instead provided at a position which does not coincide with the position immediately on the bit line contact 105 (e.g., at an upper side of the gate electrode 104 of the selection transistor 31) by using an intermediate wiring layer at a position which does not coincide with the position immediately on the bit line contact 105 (e.g., at an upper side of the gate electrode 104 of the selection transistor 31).

An interlayer dielectric layer ILD is formed in the memory cell MC. The interlayer insulating layer ILD includes an insulating layer 120.

The insulating layer 120 is provided on the upper surface of the element isolation area 110. The insulating layer 120 electrically separates the MTJ element 30, the bit line 107, the bit line contacts 105 and 106, the source line 109, the source line contact 108, and the gate electrode 104 from each other.

<1-1-5-3> Properties of MTJ Element

Here, the properties of the MTJ element will be described. A thermal stability dE, which is a data retention index of the MTJ element, is known as being expressed as $dE=(Ku \times V)/(kb \times T)$, where Ku is a magnetic anisotropy constant of the storage layer, V is a volume of the storage layer, kb is a Boltzmann constant, and T is a temperature. The thermal stability dE is known to be decreased in proportion to V. When the thermal stability dE is decreased, the data retention property of the MTJ element is decreased, but the write speed is increased. On the other hand, when the thermal stability dE is increased, the data retention property of the MTJ element is improved, but the write speed is degraded.

Here, a change in volume V of the storage layer will be briefly described for an example in which the storage layer F has a columnar shape.

First, a change in volume due to a change in cross-sectional area of the storage layer F will be described with reference to FIG. 7.

Figure 7:
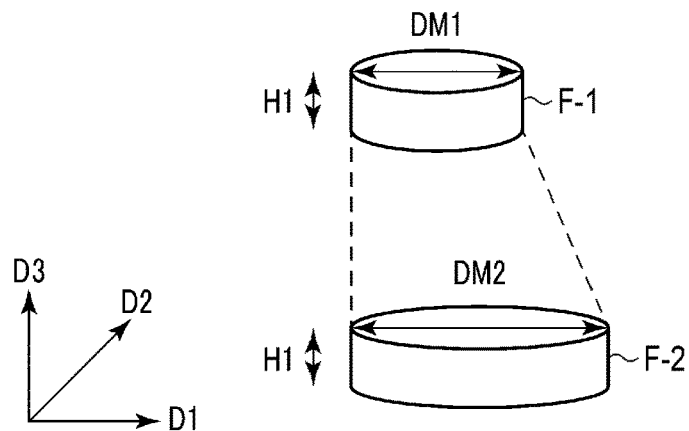
FIG. 7 is a view for explaining aspects of a change in volume of a storage layer of the memory cell.

As illustrated in FIG. 7, volumes V of two storage layers F-1 and F-2 are compared. The storage layers F-1 and F-2 have the same height H1 in a D3 direction. Meanwhile, a diameter DM1 in a cross section of the storage layer F-1 in D1 and D2 directions is smaller than a diameter DM2 in a cross section of the storage layer F-2 in the D1 and D2 directions (DM1<DM2). For this reason, a volume V1 of the storage layer F-1 is smaller than a volume V2 of the storage layer F-2 (V1<V2).

In this case, the storage layer F-1 has a higher write speed than that of the storage layer F-2. In addition, the storage layer F-2 has a higher data retention property than that of the storage layer F-1.

Next, a change in volume due to a change in height/thickness of the storage layer F will be described with reference to FIG. 8.

Figure 8:
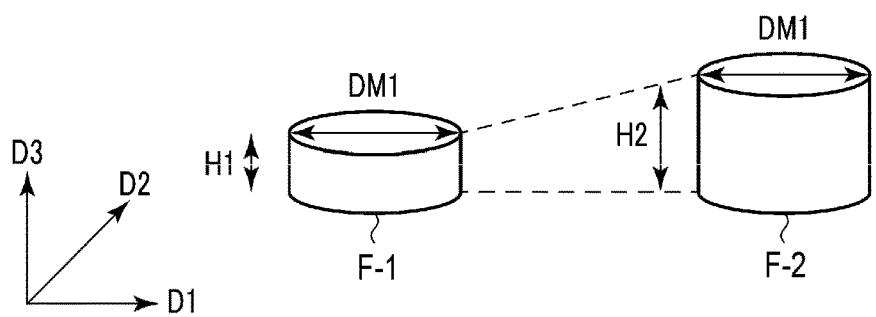
FIG. 8 is a view for explaining aspects of a change in volume of the storage layer of the memory cell.

As illustrated in FIG. 8, the volumes V of the two storage layers F-1 and F-2 are compared. The storage layers F-1 and F-2 have the same diameter DM1 in the cross section in the D1 and D2 directions. Meanwhile, a height H1 of the storage layer F-1 in a D3 direction is smaller than a height H2 of the storage layer F-2 in the D3 direction (H1<H2). For this reason, the volume V1 of the storage layer F-1 is smaller than the volume V2 of the storage layer F-2 (V1<V2).

In this case, similar to the case illustrated in FIG. 7, the storage layer F-1 has a higher write speed than that of the storage layer F-2. In addition, the storage layer F-2 has a higher data retention property than that of the storage layer F-1.

In FIGS. 7 and 8, the case in which the storage layers F-1 and F-2 having a columnar shape are different from each other in terms of one of the height and the diameter in the cross section has been described. However, the storage layers F-1 and F-2 having a columnar shape may be different from each other in terms of both of the height and the diameter in the cross section.

In addition, the volume of the storage layer may be regarded as the effective volume of the MTJ element itself. Therefore, for simplicity, the volume of the storage layer may be referred to as the volume of the MTJ element. In addition, in some instances, the volume of the storage layer or the MTJ element may be described as a size.

<1-1-6> Memory Region

A principle by which the properties of the MTJ element vary depending on the volume of the storage layer has been described above. In the present embodiment, in consideration of the aforementioned principle, the MTJ element is divided into regions according to differences in volume of the MTJ elements therein, and the regions can then be selectively used for different purposes.

Figure 9:
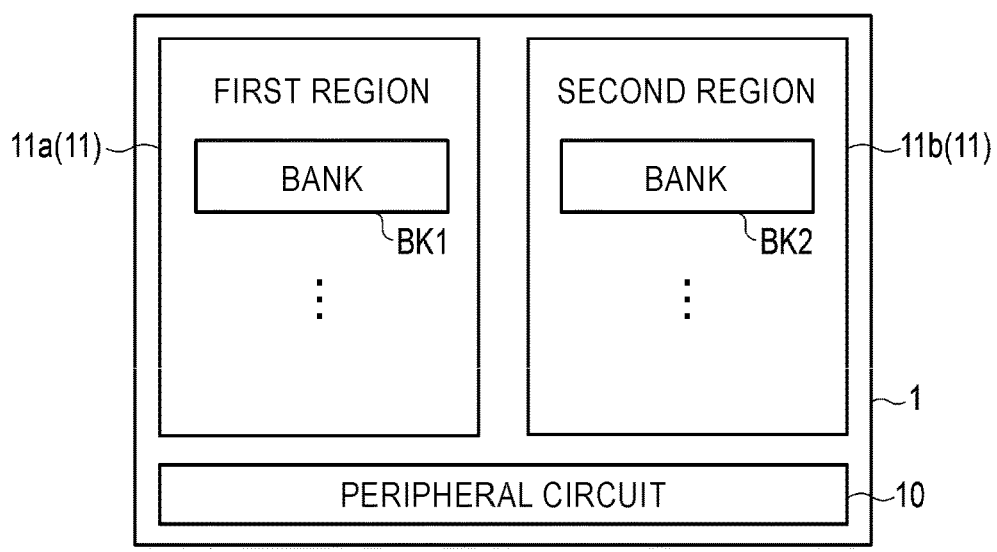
FIG. 9 is a top plan view illustrating a memory region of the semiconductor storage device according to the first embodiment.

As depicted in FIG. 9, the memory region 11 is divided into a first region 11a and a second region 11b. Further, the first region 11a includes multiple banks BK1. The second region 11b includes multiple banks BK2.

The volume of each of the MTJ elements provided in the banks BK1 is smaller than the volume of each of the MTJ elements provided in the banks BK2. That is, the bank BK1 is a bank having a higher write speed than that of the bank BK2. The bank BK2 is a bank having a higher data retention property than that of the bank BK1. In this context, a higher data retention property corresponds to an increase in expected data storage lifetime of a bank BK without the introduction of data errors beyond acceptable levels.

For this reason, the first region 11a including the banks BK1 is used as a short-term storage region. In addition, the second region 11b including the banks BK2 is used as a long-term storage region.

As described above, in the present embodiment, the regions are divided by volume of the MTJ elements therein, and the particular uses of these regions are changed accordingly.

<1-2> Operation

<1-2-1> First Write Operation

Figure 10:
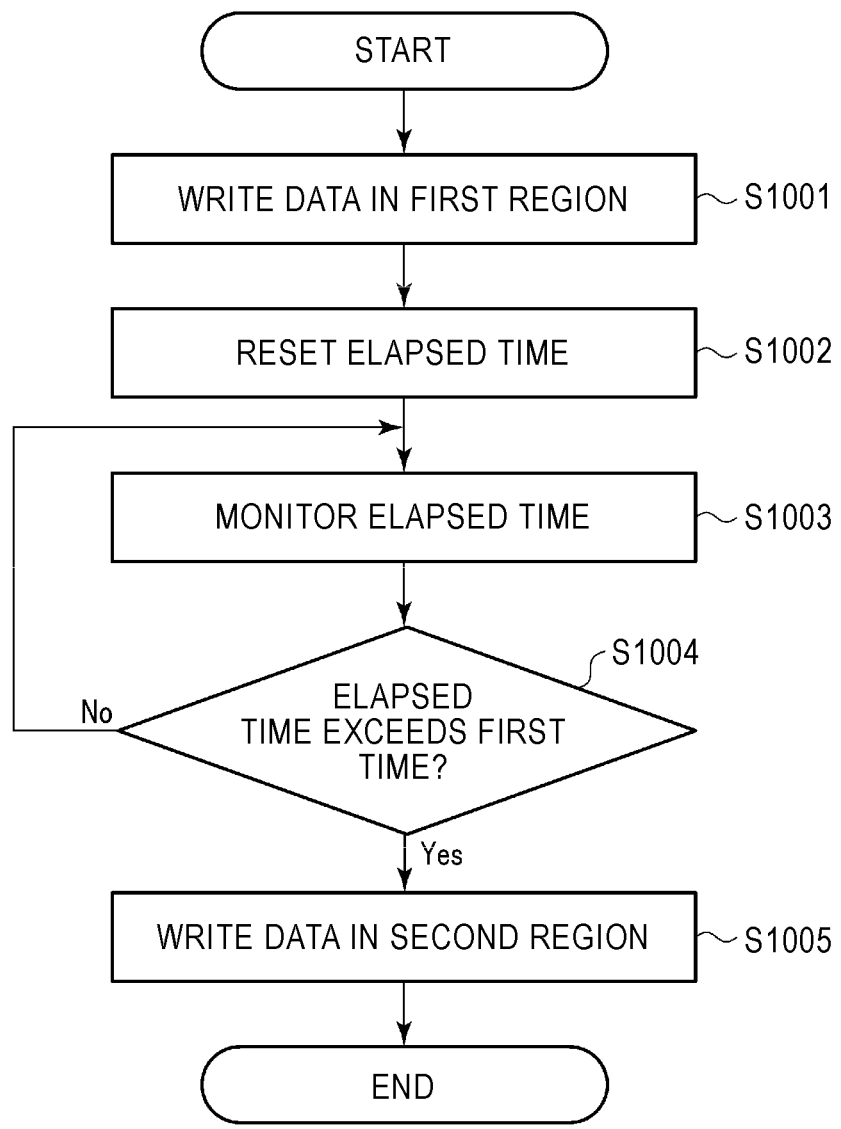
FIG. 10 is a flowchart for explaining aspects of a first write operation of the memory system including the semiconductor storage device according to the first embodiment.

Next, a first write operation of the memory system including the semiconductor storage device according to the first embodiment will be described with reference to FIG. 10.

[Step S1001]

When the memory controller 2 receives a write command from the host 3, the memory controller 2 performs a write operation with respect to the bank BK1 of the first region 11a for short-term storage purposes.

[Step S1002]

The memory controller 2 resets elapsed time information on the bank BK1, which is stored in, for example, the register 23. The elapsed time information means information which is stored for each bank BK and indicates how long it has been since the data was written in the particular bank BK.

[Step S1003]

The memory controller 2 measures, using a timer or the like, the elapsed time information for the bank BK1 stored in, for example, the register 23. Further, the memory controller 2 monitors this elapsed time information.

[Step S1004]

The memory controller 2 determines whether the elapsed time exceeds some threshold value (referred to as a first time for simplicity), stored in the register 23, for example. When it is determined that the elapsed time does not yet exceed the first time (step S1004, NO), the memory controller 2 repeats step S1003.

[Step S1005]

When it is determined that the elapsed time exceeds the first time (step S1004, YES), the memory controller 2 writes the data, presently stored in a bank BK1 of the first region 11a for short-term storage, to a bank BK2 of the second region 11b for long-term storage.

Here, the write current may be decreased because magnetization reversal of the storage layer more easily occurs when dE of the storage layer is small, and the magnetization reversal of the storage layer hardly occurs when dE of the storage layer is large. For this reason, in steps S1001 and S1005, a write defect is likely to occur when the write operation is performed using the same write current. For this reason, in the write operation in step S1005, it is necessary to increase write voltage or lengthen a write pulse in comparison with the write operation in step S1001.

As described above, in the first write operation of the memory system including the semiconductor storage device according to the first embodiment, the data are transferred from a short-term storage region to a long-term storage region in accordance with elapse of time since the data were first stored in the short-term storage region.

<1-2-2> Second Write Operation

Figure 11:
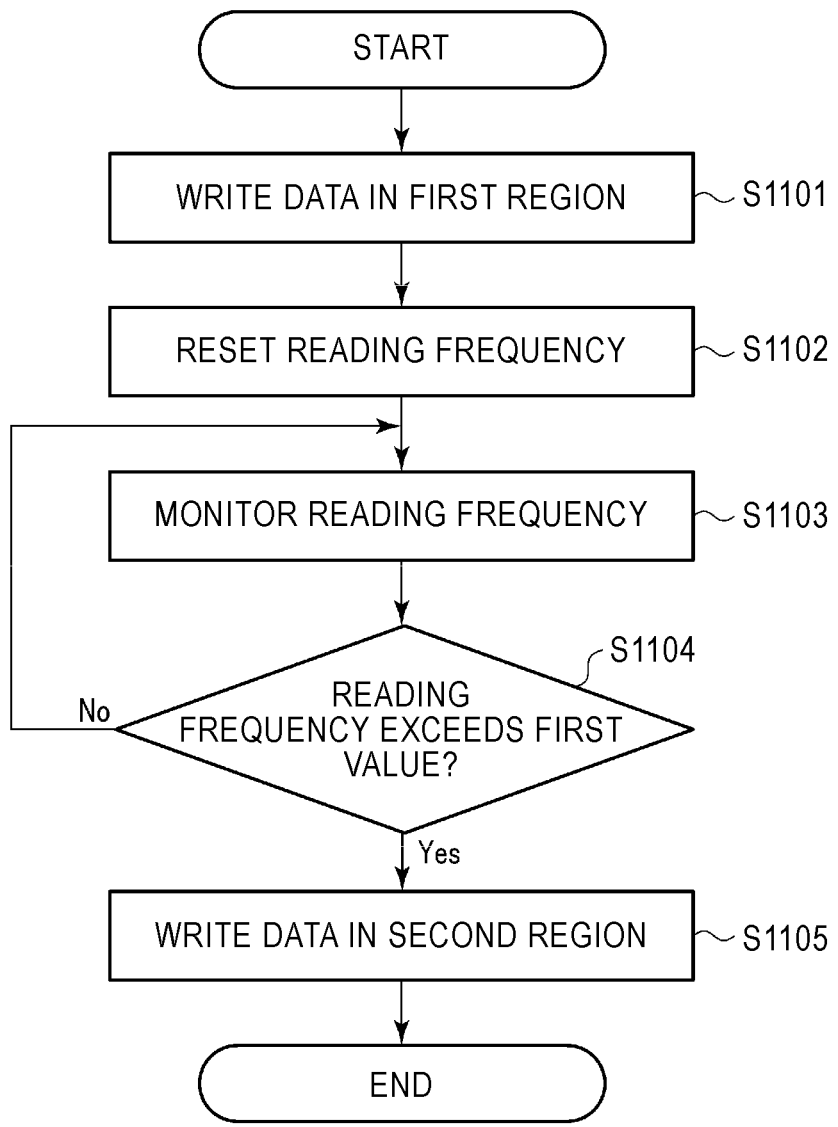
FIG. 11 is a flowchart for explaining aspects of a second write operation of the memory system including the semiconductor storage device according to the first embodiment.

Next, a second write operation of the memory system including the semiconductor storage device according to the first embodiment will be described with reference to FIG. 11.

[Step S1101]

When the memory controller 2 receives a write command from the host 3, the memory controller 2 performs the write operation with respect to a bank BK1 of the first region 11a for short-term storage.

[Step S1102]

The memory controller 2 then resets reading frequency information for the bank BK1, which is stored in the register 23, for example. Here, reading frequency refers to the number of times the reading operation is performed on a bank BK, or the like, in a given period of time. In particular, here the reading frequency information indicates how many times a read operation is performed on the bank after the data is written in the bank BK.

[Step S1103]

When a read operation is performed on a bank BK1, the memory controller 2 counts up the reading frequency information for the bank BK1 in the register 23. Further, the memory controller 2 monitors the reading frequency information for the bank BK1 stored in the register 23.

[Step S1104]

The memory controller 2 determines whether the reading frequency exceeds some threshold value (referred to as a first value for simplicity) stored in the register 23, for example. When it is determined that the reading frequency does not exceed the first value (step S1104, NO), the memory controller 2 repeats step S1103.

[Step S1105]

When it is determined that the reading frequency exceeds the first value (step S1104, YES), the memory controller 2 writes the data presently stored in the bank BK1 of the first region 11a for short-term storage to the bank BK2 of the second region 11b for long-term storage.

In steps S1101 and S1105, a write defect is likely to occur when the write operation is performed using the same write current. For this reason, it is necessary to increase write voltage or lengthen a write pulse in comparison with the write operation in step S1101 for the write operation in step S1105.

As described above, in the memory system including the semiconductor storage device according to the first embodiment, the data are transferred from the short-term storage region to the long-term storage region in accordance with the reading frequency information.

In addition, in the memory system including the semiconductor storage device according to the first embodiment, the writing frequency (that is, how often the writing operation is performed in a given time period) for the short-term storage region is generally greater than the writing frequency for the long-term storage region.

<1-3> Specific Examples

Here, specific examples of uses and functions of the first region 11a and the second region 11b in particular structures and scenarios will be discussed.

As Specific Example 1, the first region 11a is a L1 cache (which is also referred to as a primary cache and functions as a part of the data buffer 22) and the second region 11b is an L2 cache (which is also referred to as a secondary cache and functions as a part of the data buffer 22).

As Specific Example 2, the first region 11a is a L2 cache and the second region 11b is an L3 cache (which is also referred to as a tertiary cache and functions as apart of the data buffer 22).

As Specific Example 3, the first region iia is a L3 cache and the second region 11b is a DRAM substitute.

As Specific Example 4, the first region 11a is a short-term storage DRAM substitute and the second region 11b is a long-term storage DRAM substitute.

As Specific Example 5, the first region 11a is a DRAM substitute and the second region 11b is a storage class memory (SCM).

The first region iia and the second region 11b may be also be used in other scenarios and structures than those described in the aforementioned specific examples and the disclosure is not limited to the specific examples.

<1-4> Effect

According to the embodiment, the volume of the MTJ element varies in accordance with storage region. Furthermore, the use of each of the different storage regions is varied. Specifically, when the write command is received, the data are written in the short-term storage region first. The data may then be transferred to a long-term retention region when the data stored in the short-term storage region satisfies a predetermined condition.

As described above, both of a good write speed and a good data retention property may be provided by changing the usages in accordance with the property of the storage region, and a size of a package (the semiconductor storage device or the memory system) may be reduced. As a result, it is possible to provide the semiconductor storage device better characteristics for many applications.

<1-5> Modified Example

In the first embodiment, the configuration in which both of the first region 11a and the second region 11b operate as memory has been described. However, the present disclosure is not limited thereto, and any one of the first region 11a and the second region 11b may be a logic circuit including a MTJ element. For example, in the logic circuit, a higher-speed operation may be performed if a volume of the MTJ element is decreased. For example, in a case in which the first region 11a is a logic circuit configured with the MTJ element, the first region 11a functions as, for example, a part of the peripheral circuit 10.

<2> Second Embodiment

A second embodiment will be described. In the second embodiment, a case in which the memory region is divided into three regions will be described. In addition, a basic configuration and a basic operation of a device according to the second embodiment are identical to those of the device according to the aforementioned first embodiment. Therefore, a description of items, which have been described in the aforementioned first embodiment, and a description of items, which may otherwise be easily derived from the description of the first embodiment, will be omitted.

<2-1> Memory Region

The memory region 11 according to the second embodiment will be described with reference to FIG. 12.

Figure 12:
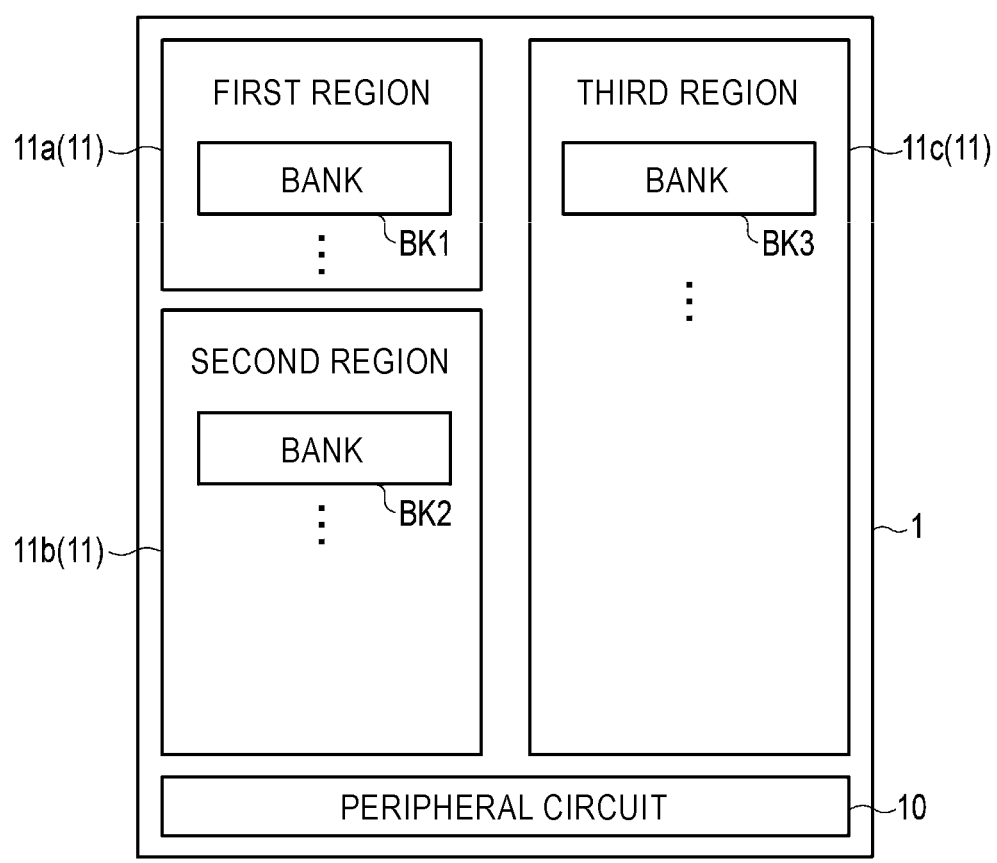
FIG. 12 is a top plan view illustrating a memory region of a semiconductor storage device according to a second embodiment.

As illustrated in FIG. 12, the memory region 11 is divided into a first region 11a, a second region 11b, and a third region 11c. Further, the first region 11a includes multiple banks BK1. In addition, the second region 11b includes multiple banks BK2. In addition, the third region 11c includes multiple banks BK3.

The volume of the MTJ element in the bank BK1 is smaller than the volume of the MTJ element in the bank BK2. In addition, the volume of the MTJ element in the bank BK2 is smaller than the volume of the MTJ element in the bank BK3. In other words, among the bank BK1, the bank BK2, and the bank BK3, the MTJ element in the bank BK1 has the smallest volume.

The bank BK2 is a bank having a higher write speed than that of the bank BK3. The bank BK1 is a bank having a higher write speed than that of the bank BK2. In other words, among the bank BK1, the bank BK2, and the bank BK3, the bank BK1 has the highest write speed.

In addition, the bank BK2 is a bank having a higher data retention property than that of the bank BK1. In addition, the bank BK3 is a bank having a higher data retention property than that of the bank BK2. In other words, among the bank BK1, the bank BK2, and the bank BK3, the bank BK3 has the highest data retention property.

For this reason, the first region 11a including the bank BK1 having the higher write speed is used as a short-term storage region. The second region 11b including the bank BK2 having an intermediate write speed and an intermediate data retention property is used as a medium-term storage region. In addition, the third region 11c including the bank BK3 having the high data retention property is used as a long-term storage region.

As described above, regions are divided for each volume of the MTJ element, and the uses of respective regions are changed.

<2-2> Operation

<2-2-1> First Write Operation

Figure 13:
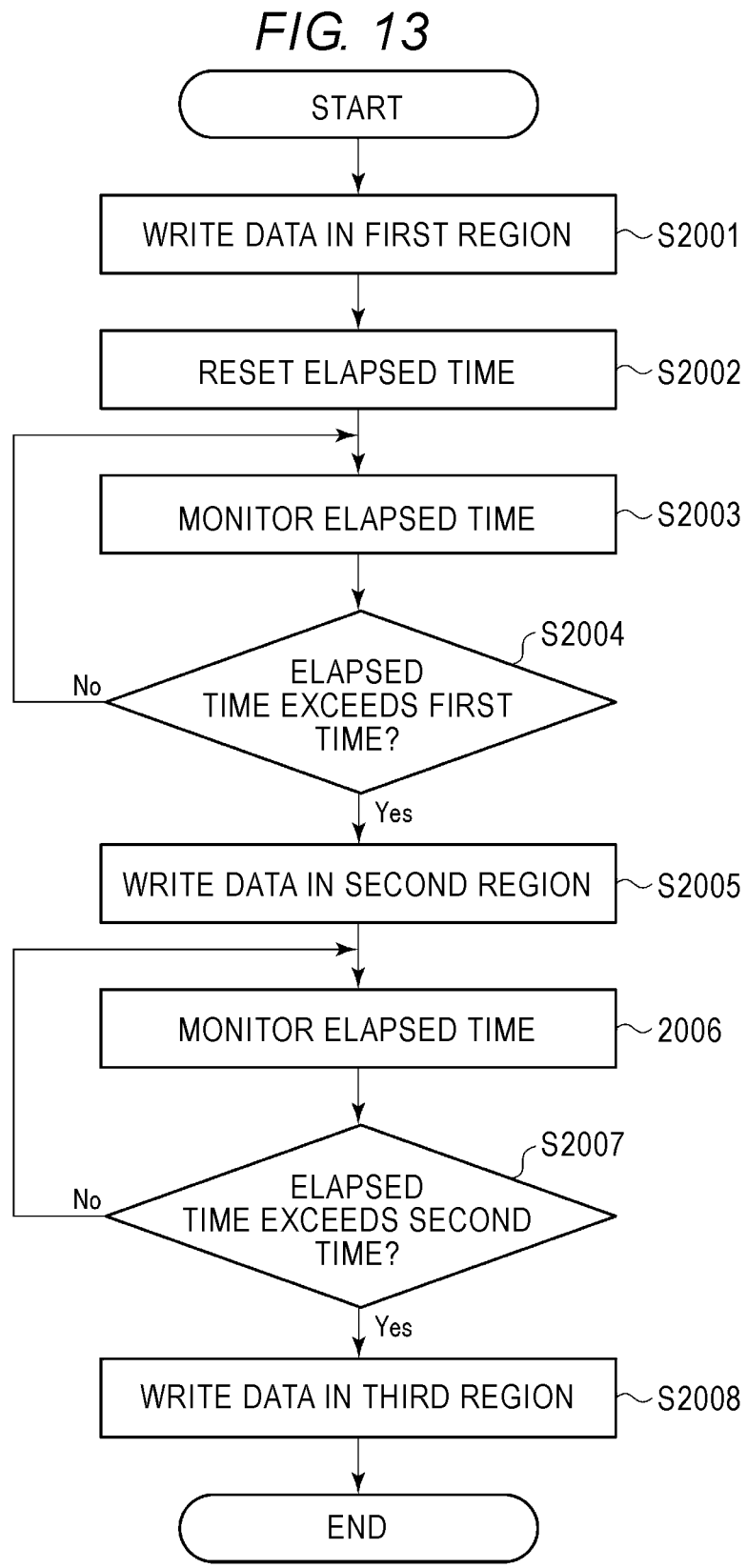
FIG. 13 is a flowchart for explaining aspects of a first write operation of a memory system including the semiconductor storage device according to the second embodiment.

Next, a first write operation of the memory system including the semiconductor storage device according to the second embodiment will be described with reference to FIG. 13.

[Step S2001] to [Step S2005]

The operations in steps S2001 to S2005 are identical to the operations in steps S1001 to S1005.

[Step S2006]

The memory controller 2 measures, using a timer or the like, elapsed time information on the bank BK2 stored in the register 23. Further, the memory controller 2 monitors the elapsed time information.

[Step S2007]

The memory controller 2 determines whether the elapsed time exceeds threshold value information (second time stored in, for example, the register 23. When it is determined that the elapsed time does not exceed the second time (step S2007, NO), the memory controller 2 repeats step S2006.

[Step S2008]

When it is determined that the elapsed time exceeds the second time (step S2007, YES), the memory controller 2 writes the data, which are stored in the bank BK2 of the second region 11b for medium-term storage, in the bank BK3 of the third region 11c for long-term storage.

Further, in steps S2001, S2005, and S2008, a write defect is likely to occur when the write operation is performed by using the same write current. For this reason, in the write operation in step S2005, it is necessary to increase write voltage or lengthen a write pulse in comparison with the write operation in step S2001. Similarly, in the write operation in step S2008, it is necessary to increase write voltage or lengthen a write pulse in comparison with the write operation in step S2005.

As described above, in the first write operation of the memory system including the semiconductor storage device according to the second embodiment, data are transferred from the short-term storage region to the medium-term storage region, and from the medium-term storage region to the long-term storage region, in accordance with the elapsed time since the data were stored.

<2-2-2> Second Write Operation

Figure 14:
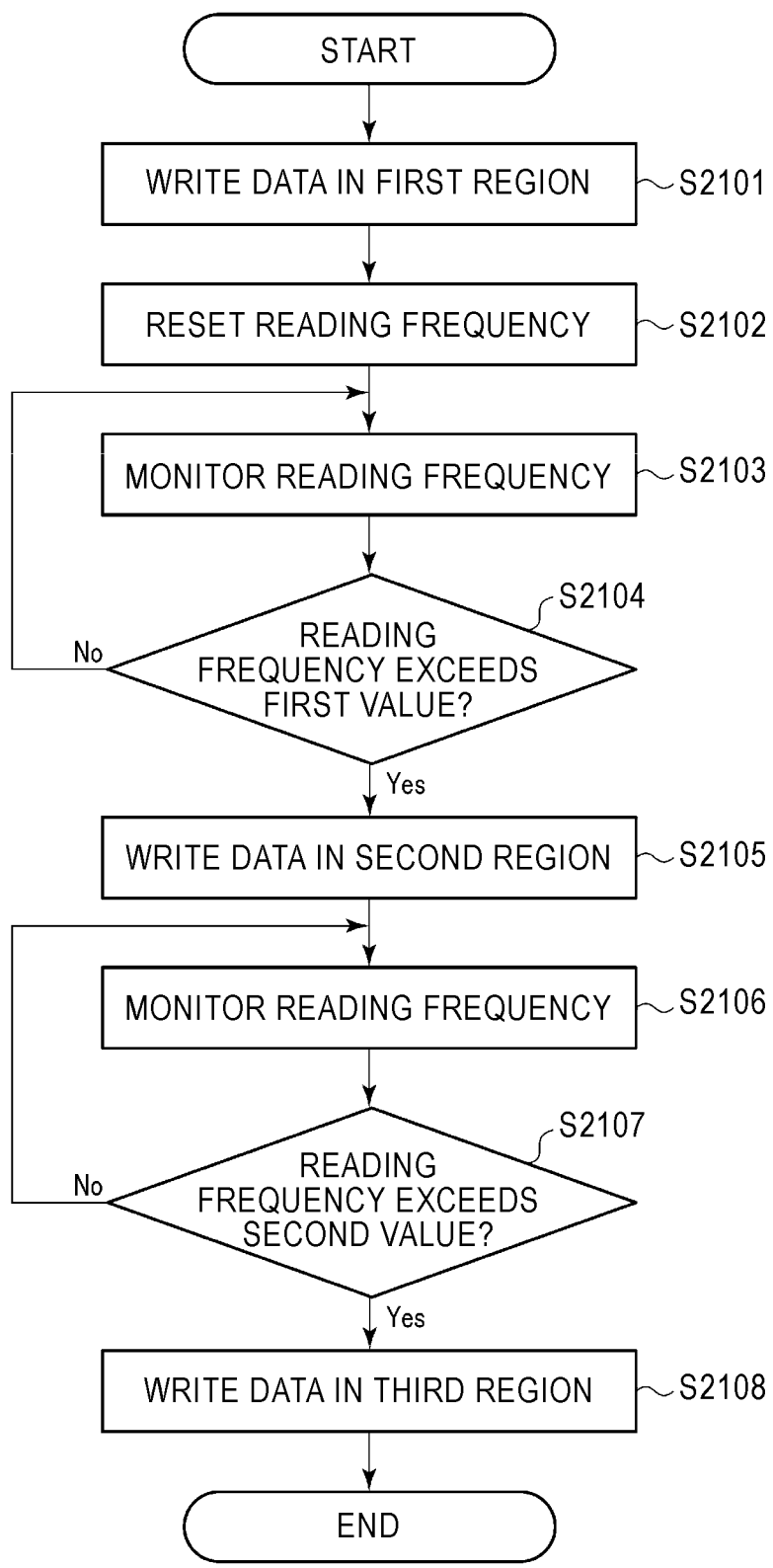
FIG. 14 is a flowchart for explaining aspects of a second write operation of the memory system including the semiconductor storage device according to the second embodiment.

Next, a second write operation of the memory system including the semiconductor storage device according to the second embodiment will be described with reference to FIG. 14.

[Step S2101] to [Step S2105]

The operations in steps S2101 to S2105 are identical to the operations in steps S1101 to S1105.

[Step S2106]

When the read operation is performed with respect to the bank BK2, the memory controller 2 counts up reading frequency information on the bank BK2 which is stored in, for example, the register 23. Further, the memory controller 2 monitors the reading frequency information on the bank BK2 which is stored in the register 23.

[Step S2107]

The memory controller 2 determines whether the reading frequency exceeds some threshold value (referred to as a second value for simplicity) stored in, for example, the register 23. When it is determined that the reading frequency does not exceed the second value (step S2107, NO), the memory controller 2 repeats step S2106.

[Step S2108]

When it is determined that the reading frequency exceeds the second value (step S2107, YES), the memory controller 2 writes the data, which are presently stored in the bank BK2 of the second region lib for medium-term storage, in the bank BK3 of the third region 11c long-term storage.

Further, in steps S2101, S2105, and S2108, a write defect is likely to occur when the write operation is performed using the same write current. For this reason, in the write operation in step S2105, it is necessary to increase write voltage or lengthen a write pulse in comparison with the write operation in step S2101. Similarly, in the write operation in step S2108, it is necessary to increase write voltage or lengthen a write pulse in comparison with the write operation in step S2105.

As described above, in the memory system including the semiconductor storage device according to the second embodiment, the data are transferred from the short-term storage region to the medium-term storage region and from the medium-term storage region to the long-term storage region in accordance with the reading frequency since the data were stored.

In addition, in the memory system including the semiconductor storage device according to the second embodiment, the writing frequency in the short-term storage region is greater than the writing frequency in the medium-term storage region. In addition, the writing frequency in the medium-term storage region is greater than the writing frequency in the long-term storage region.

<2-3> Specific Examples

Here, specific examples of the first region 11a, the second region 11b, and the third region 11c will be exemplified.

As Example 1, an example in which the first region 11a is a L1 cache, the second region 11b is an L2 cache, and the third region 11c is an L3 cache may be considered.

In addition, as Specific Example 2, an example in which the first region iia is an L2 cache, the second region 11b is an L3 cache, and the third region 11c is a DRAM substitution may be considered.

Further, as Specific Example 3, an example in which the first region 11a is an L3 cache, the second region 11b is a short-term. storage DRAM substitution, and the third region 11c is a long-term storage DRAM substitution may be considered.

In addition, as Specific Example 4, an example in which the first region 11a is a L3 cache, the second region 11b is a DRAM substitution, and the third region 11c is an SCM may be considered.

In addition, as Specific Example 5, an example in which the first region 11a is a short-term storage DRAM substitution, the second region 11b is a long-term storage DRAM substitution, and the third region 11c is an SCM may be considered.

Further, the specific examples of the first region 11a, the second region 11b, and the third region 11c may be specific examples other than the aforementioned examples.

<2-4> Effect

Similar to the first embodiment, according to the second embodiment, the volume of the MTJ element varies in accordance with a region. Further, similar to the first embodiment, the use is changed for each region. The region is more minutely divided in the second embodiment than in the first embodiment. For this reason, it is possible to more selectively use the regions for particular uses.

According to the second embodiment described above, the effects substantially identical to the effects of the first embodiment may be obtained.

<2-5> Modified Example

In the second embodiment, the case in which the first region 11a, the second region 11b, and the third region 11c operate as memory has been described. However, the present disclosure is not limited thereto, and any one of the first region 11a, the second region 11b, and the third region 11c may be a logic circuit configured with the MTJ element. For example, in a case in which the first region 11a is a logic circuit configured with the MTJ element, the first region 11a functions as a part of, for example, the peripheral circuit 10.

<3> Third Embodiment

A third embodiment will be described. In the third embodiment, a case in which the memory region is divided into four regions will be described. In addition, the basic configuration and the basic operation of a device according to the third embodiment are substantially identical to those of the devices according to the aforementioned first and second embodiments. Therefore, a description of items which have been previously described will be omitted.

<3-1> Memory Region

The memory region 11 according to the third embodiment will be described with reference to FIG. 15.

Figure 15:
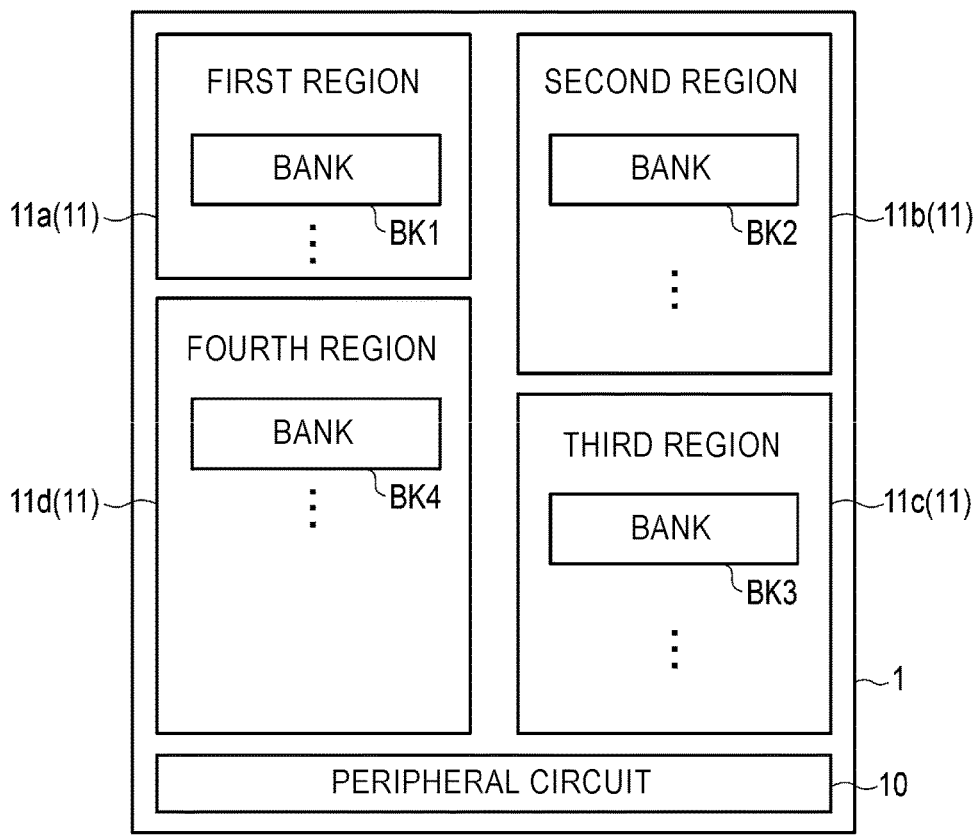
FIG. 15 is a top plan view illustrating a memory region of a semiconductor storage device according to a third embodiment.

As illustrated in FIG. 15, the memory region 11 is divided into a first region 11a, a second region 11b, a third region 11c, and a fourth region 11d. Further, the first region 11a includes multiple banks BK1. In addition, the second region 11b includes multiple banks BK2. In addition, the third region 11c includes multiple banks BK3. In addition, the fourth region 11d includes multiple banks BK4.

The volume of the MTJ element in the bank BK1 is smaller than the volume of the MTJ element in the bank BK2. In addition, the volume of the MTJ element in the bank BK2 is smaller than the volume of the MTJ element in the bank BK3. Further, the volume of the MTJ element in the bank BK3 is smaller than the volume of the MTJ element in the bank BK4. In other words, among the bank BK1, the bank BK2, the bank BK3, and the bank BK4, the MTJ element of the bank BK1 has the smallest volume.

The bank BK3 is a bank having a higher write speed than that of the bank BK4. The bank BK2 is a bank having a higher write speed than that of the bank BK3. The bank BK1 is a bank having a higher write speed than that of the bank BK2. In other words, among the bank BK1, the bank BK2, the bank BK3, and the bank BK4, the bank BK1 has the highest write speed.

In addition, the bank BK2 is a bank having a higher data retention property than that of the bank BK1. In addition, the bank BK3 is a bank having a higher data retention property than that of the bank BK2. In addition, the bank BK4 is a bank having a higher data retention property than that of the bank BK3. In other words, among the bank BK1, the bank BK2, the bank BK3, and the bank BK4, the bank BK4 has the highest data retention property.

In the third embodiment, regions are divided for each volume of the MTJ element, and the uses of respective regions are changed.

<3-2> Specific Example Applications

Here, specific example applications or uses for the first region 11a, the second region 11b, the third region 11c, and the fourth region 11d will be described.

For Specific Example 1, the first region 11a is an L1 cache, the second region 11b is an L2 cache, the third region 11c is an L3 cache, and the fourth region 11d is DRAM (or DRAM equivalent).

For Specific Example 2, the first region 11a is a L2 cache, the second region 11b is a L3 cache, the third region 11c is DRAM (or DRAM equivalent), and the fourth region 11d is an SCM.

For Specific Example 3, the first region 11a is an L2 cache, the second region 11b is an L3 cache, the third region 11c is a short-term storage DRAM(or DRAM equivalent), and the fourth region 11d is a long-term storage DRAM (or DRAM equivalent).

For Specific Example 4, the first region 11a is an L3 cache, the second region 11b is a short-term storage DRAM (or DRAM equivalent), the third region 11c is a long-term storage DRAM (or DRAM equivalent), and the fourth region 11d is an SCM.

Furthermore, the first region 11a, the second region 11b, the third region 11c, and the fourth region 11d may also be used in specific examples other than the aforementioned specific examples.

<3-3> Effect

Similar to the first embodiment, according to the third embodiment, the volume of the MTJ element is changed in accordance with disposition region within the device. Further, similar to the first embodiment, the use is different for each region. However, the region is more minutely divided in the third embodiment in comparison to the second embodiment. For this reason, it is possible to more selectively use the regions for particular uses.

According to the third embodiment, the effects substantially identical to that of the first embodiment can be obtained.

<3-4> Modified Example

In the third embodiment, the case in which the first region 11a, the second region 11b, the third region 11c, and the fourth region 11d operate as memory has been described. However, the present disclosure is not limited thereto, and any one of the first region 11a, the second region 11b, the third region 11c, and the fourth region 11d may be or include a logic circuit configured with a MTJ element or elements. For example, in a case in which the first region 11a is a logic circuit configured with a MTJ element, the first region 11a functions as a part of, for example, a peripheral circuit 10.

<4> Fourth Embodiment

A fourth embodiment will be described. In the fourth embodiment, a semiconductor storage device, such as multi-chip package (MCP), in which multiple chips or layers using MTJ elements are stacked is to be described. In addition, the basic configuration and the basic operation of a device according to the fourth embodiment are substantially identical to those of the devices according to the first, second, and third embodiments. Therefore, a description of items that have been previously described will be omitted.

<4-1> Configuration

A basic configuration of the semiconductor storage device according to the fourth embodiment will be described with reference to FIG. 16.

Figure 16:
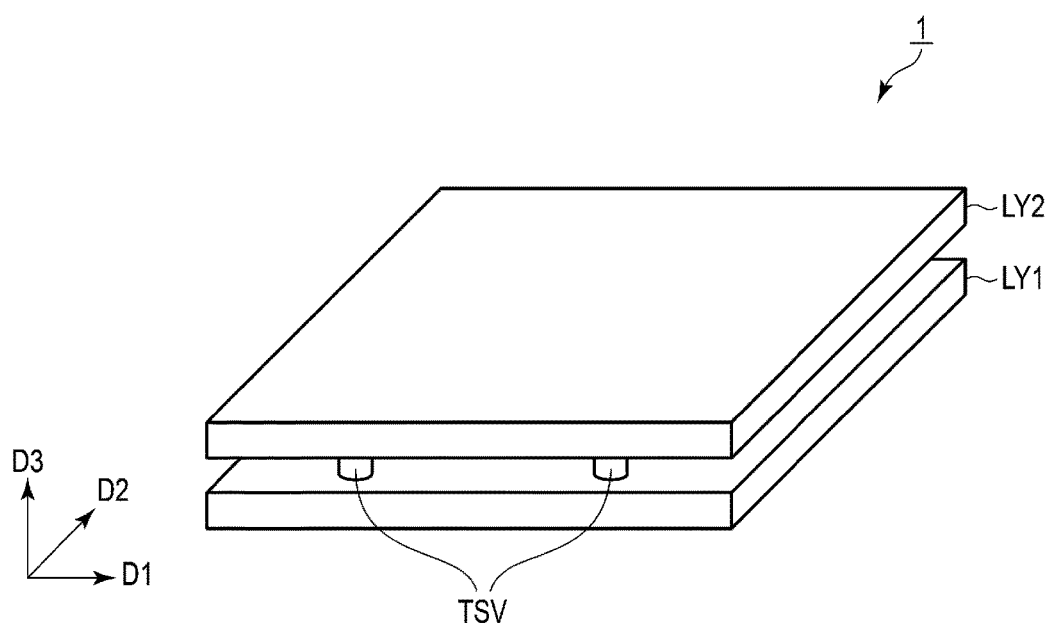
FIG. 16 is a perspective view illustrating a semiconductor storage device according to a fourth embodiment.

As illustrated in FIG. 16, the semiconductor storage device 1 according to the fourth embodiment has, for example, a first layer LY1 and a second layer LY2, the functions and characteristics of which are different from each other. Furthermore, the first layer LY1 and the second layer LY2 are stacked in the D3 direction and electrically connected using a through silicon via (TSV). In addition, when the first layer LY1 and the second layer LY2 are not being distinguished from each other in description, the first and second layers LY1 and LY2 may be simply referred to simply as a layer LY.

Further, the semiconductor storage device 1 may include only a single layer or may include multiple layers.

A first example of a layer according to the fourth embodiment will be described with reference to FIG. 17.

Figure 17:
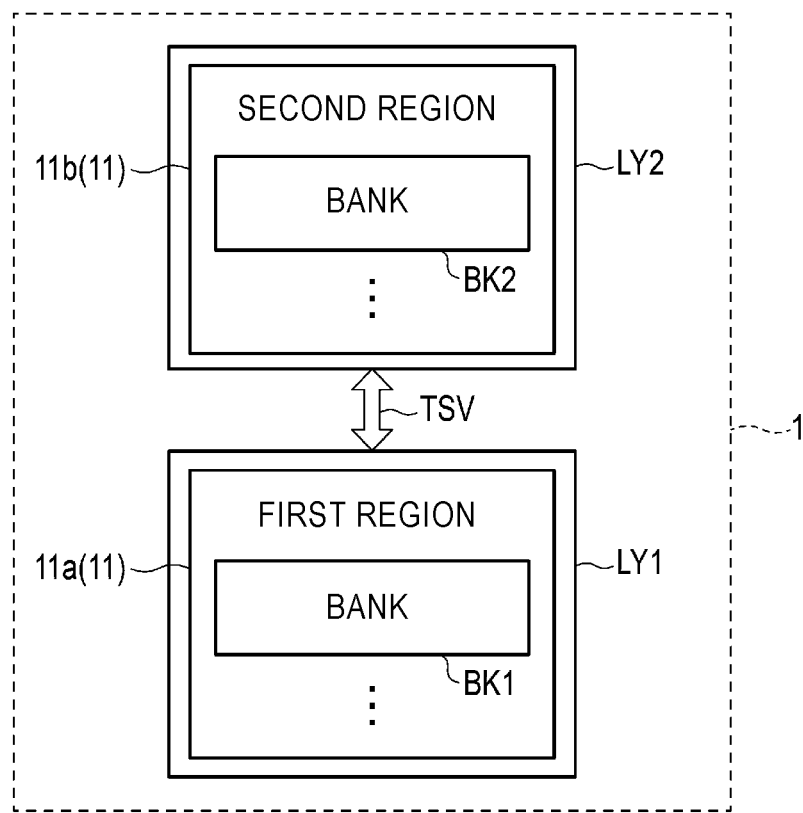
FIG. 17 is a plan view illustrating a memory region of the semiconductor storage device according to the fourth embodiment.

As illustrated in FIG. 17, the first layer LY1 includes a first region 11a. Further, the first region 11a includes multiple banks BK1. In addition, the second layer LY2 includes a second region 11b. Further, the second region 11b includes multiple banks BK2.

The volume of the MTJ element in the bank BK1 is smaller than the volume of the MTJ element in the bank BK2.

For this reason, the bank BK1 is a bank with a higher write speed than that of the bank BK2. In addition, the bank BK2 is a bank with a greater data retention property than that of the bank BK1. In this context, a greater, longer, or a higher data retention property refers to the ability of the bank BK2 to retain data without introduction of errors (e.g., thermally induced errors) over time (or data loss) as compared to bank BK1.

Similar to the first embodiment, the regions are divided for each volume of the MTJ element, and the uses of respective regions are varied.

A second example of the layer according to the fourth embodiment will be described with reference to FIG. 18.

Figure 18:
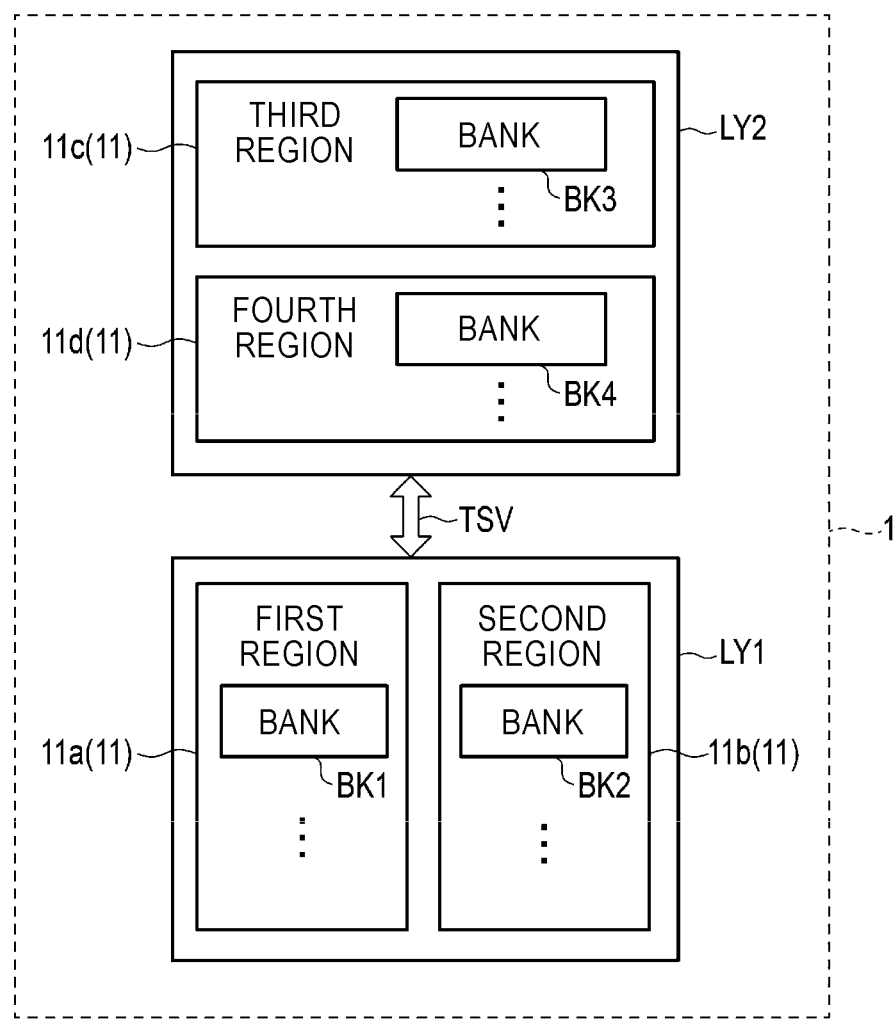
FIG. 18 is a plan view illustrating the memory region of the semiconductor storage device according to the fourth embodiment.

As illustrated in FIG. 18, the first layer LY1 includes a first region 11a and a second region 11b. The first region 11a includes multiple banks BK1. The second region 11b includes multiple banks BK2. The second layer LY2 includes a third region 11c and a fourth region 11d. The third region 11c includes multiple banks BK3. The fourth region 11d includes multiple banks BK4.

The volume of the MTJ element in the bank BK1 is smaller than the volume of the MTJ element in the bank BK2. In addition, the volume of the MTJ element in the bank BK2 is smaller than the volume of the MTJ element in the bank BK3. Further, the volume of the MTJ element in the bank BK3 is smaller than the volume of the MTJ element in the bank BK4. In other words, among the bank BK1, the bank BK2, the bank BK3, and the bank BK4, the MTJ element of the bank BK1 has the smallest volume.

That is, among the bank BK1, the bank BK2, the bank BK3, and the bank BK4, the bank BK1 has the highest write speed. In addition, among the bank BK1, the bank BK2, the bank BK3, and the bank BK4, the bank BK4 has the highest data retention property.

Similar to the third embodiment, the regions are divided for each volume of the MTJ element, and the uses of respective regions are varied.

In addition, the disposition of the respective layers is not limited thereto but may be appropriately changed. In addition, the number of stacked layers is arbitrary. In addition, the order in which the respective layers are stacked may be appropriately changed.

<4-2> Effect

According to the aforementioned fourth embodiment, multiple chips using the MTJ elements are stacked. Further, as the multiple layers are connected through a TSV or the like, multiple operations may be achieved in the package. As a result, effects substantially identical to those of the aforementioned first through third embodiments can be obtained.

<5> Fifth Embodiment

A fifth embodiment will be described. In the fifth embodiment, a memory system, such as a system-in package (SiP), in which multiple chips using MOSFET and multiple chips using the MTJ element are stacked will be described. In addition, the basic configuration and the basic operation of a device according to the fifth embodiment are substantially identical to those of the devices according to the previously described embodiments. Therefore, description of previously described items will be omitted.

<5-1> Configuration

A basic configuration of the memory system including the semiconductor storage device according to the fifth embodiment will be schematically described with reference to FIG. 19.

Figure 19:
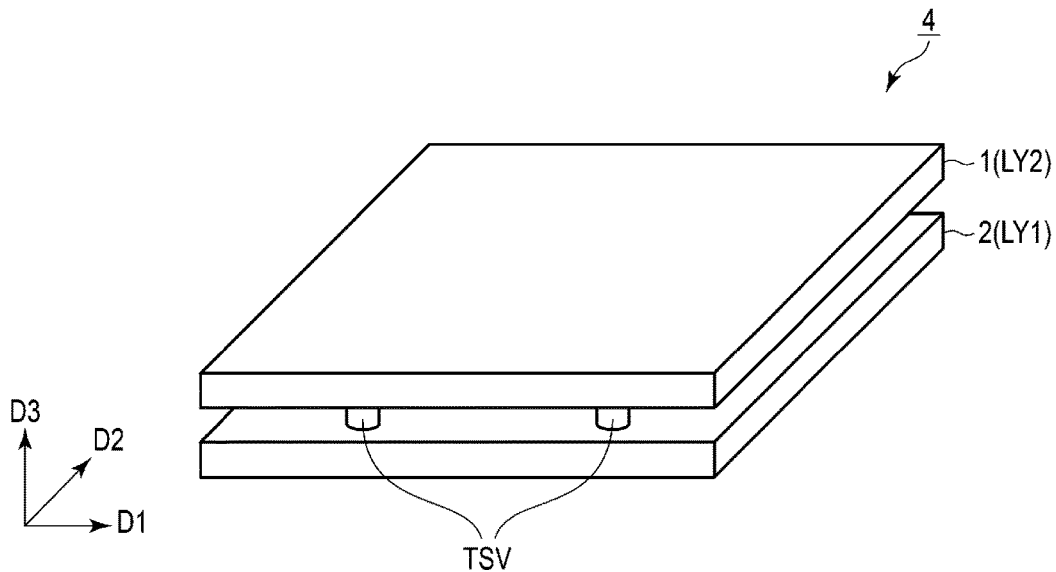
FIG. 19 is a perspective view illustrating a memory system including a semiconductor storage device according to a fifth embodiment.

As illustrated in FIG. 19, a memory system 4 including the semiconductor storage device according to the fifth embodiment has, for example, a first layer LY1 and a second layer LY2 the functions and characteristics of which are different from each other. For example, the first layer LY1 is a memory controller 2. In addition, for example, the second layer LY2 is a semiconductor storage device 1. Further, the first layer LY1 and the second layer LY2 are stacked in the D3 direction and electrically connected using a TSV or the like.

Further, the semiconductor storage device 1 may include multiple layers.

Subsequently, an example of a layer according to the fifth embodiment will be described with reference to FIG. 20.

Figure 20:
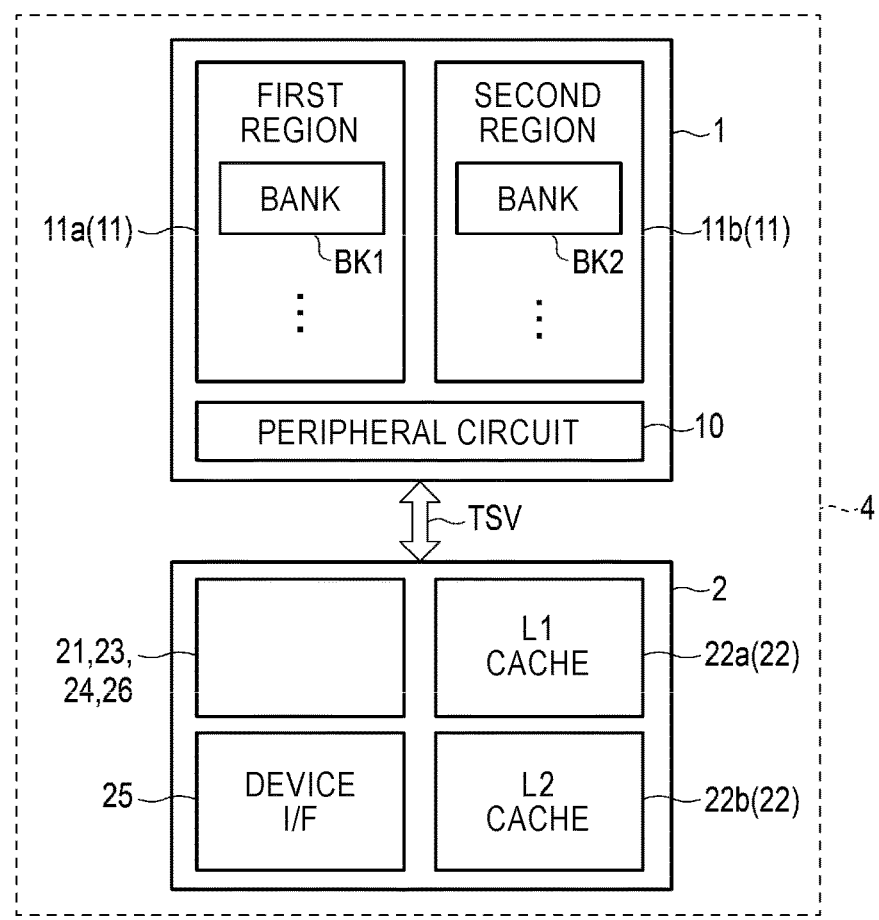
FIG. 20 is a plan view illustrating the memory system including the semiconductor storage device according to the fifth embodiment.

As illustrated in FIG. 20, the first layer LY1 includes a host interface 21, a data buffer 22 including an L1 cache 22a and an L2 cache 22b, a register 23, a CPU 24, a device interface (I/F) 25, and an ECC circuit 26.

The second layer LY2 includes a first region 11a and a second region 11b. The first region 11a includes multiple banks BK1. The second region 11b includes multiple banks BK2.

The volume of the MTJ element in the bank BK1 is smaller than the volume of the MTJ element in the bank BK2.

For this reason, the bank BK1 has a higher write speed than that of the bank BK2. In addition, the bank BK2 is a bank having a higher data retention property than that of the bank BK1.

Similar to the first embodiment, the regions are divided for each volume of the MTJ element, and the uses of respective regions are different in the fifth embodiment.

In addition, the example of the respective layers is not limited thereto, but may be changed. In addition, the number of stacked layers is arbitrary. In addition, the order in which the respective layers are stacked may be changed.

<5-2> Effect

According to the fifth embodiment, the multiple chips (or layers) using the MOSFET and the multiple chips (or layers) using the MTJ element are stacked. Further, by connecting the multiple chips (or layers) using a TSV or the like, it is possible to implement several different operations in the package. As a result, the effects identical to the effects of the previously described embodiments can be obtained.

<6> Other Examples

The previously described embodiments are examples in which the memory region 11 is divided in accordance with the volume of the MTJ elements and these different regions are then selectively used for different functions/purposes. Depicted areas and arrangements of the respective regions are only examples and may be changed.

In addition, in the previously described embodiments, a case in which the first example configuration was applied as the configuration of the memory cell MC was specifically described. However, the second example configuration may be applied as the configuration of the memory cell MC in these embodiments, and it is possible to obtain substantially identical effects as those obtained when the first example configuration is applied.

In addition, the memory system or the semiconductor storage device may be packaged as single components.

In addition, indirect connection of components or elements can be made, for example, some other component such as a transistor or a resistor may be interposed between components or elements described as "connected" or "in connection" to one another in the description.

Here, MRAM, which stores data using a magnetoresistive effect element, such as a magnetic tunnel junction (MTJ) element, as a variable resistance element, has been described as an example, but the present disclosure is not limited thereto.

For example, the same concepts and description is also applicable to a semiconductor storage device having a variable resistance memory similar to MRAM, for example, a variable resistance element such as those in a resistive random access memory (ReRAM), a phase-change random access memory (PCRAM), or the like that stores data using a resistance change.

In addition, regardless whether a device functions as volatile memory or nonvolatile memory, the same concepts and description is also applicable to a semiconductor storage device having an element capable of storing data by a resistance change caused by applying current or voltage, or capable of reading stored data by converting a resistance difference caused by a resistance change into a current difference or a voltage difference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a plurality of first memory elements in a first region;
   a plurality of second memory elements in a second region, the second memory elements each having a physical volume that is greater than a physical volume of each first memory element; and
   a controller configured to first write data to the plurality of first memory elements and then transfer the data written to plurality of first memory elements to the plurality of second memory elements when at least one of a elapsed time since initial writing or a data reading frequency exceeds a threshold value, wherein
   the first memory elements and the second memory elements are variable resistance elements which change resistance by a spin polarization tunnel effect.

2. The semiconductor storage device according to claim 1, wherein the plurality of first memory elements and the plurality of second memory elements are magnetic random access memory (MRAM) elements.

3. The semiconductor storage device according to claim 2, wherein
   the first memory elements have a storage layer with a first diameter, and
   the second memory elements have a storage layer with a second diameter that is greater than the first diameter.

4. The semiconductor storage device according to claim 2, wherein
   the first memory elements have a storage layer with a first height dimension, and
   the second memory elements have a storage layer with a second height dimension that is greater than the first height dimension.

5. The semiconductor storage device claim 1, wherein a logic circuit is provided in the first region.

6. The semiconductor storage device according claim 1, wherein
   the first region is on a first chip,
   the second region is on a second chip, and
   the first and second chips are stacked one on each other and electrically connected.

7. The semiconductor storage device according to claim 1, further comprising:
   a first chip including the first region and the second region; and
   a second chip in which the controller is disposed, wherein
   the first chip and the second chip are stacked one on the other and electrically connected to each other.

8. A semiconductor storage device, comprising:
   a plurality of first memory elements in a first region, the first memory elements having a first writing speed and a first data retention property;
   a plurality of second memory elements in a second region, the second memory elements having a second writing speed that is slower than the first writing speed and a second data retention property that is longer than the first data retention property; and a controller configured to initially write data to the plurality of first memory elements and then transfer the data written to plurality of first memory elements to the plurality of second memory elements when at least one of an elapsed time since initial writing or a data reading frequency exceeds a threshold value, wherein
   the first memory elements and the second memory elements are variable resistance elements which change resistance by a spin polarization tunnel effect.

9. The semiconductor storage device according to claim 8, wherein the plurality of first memory elements and the plurality of second memory elements are magnetic random access memory (MRAM) elements.

10. The semiconductor storage device according to claim 9, wherein
    the first memory elements have a storage layer with a first physical volume, and
    the second memory elements have a storage layer with a second physical volume that is greater than the first physical volume.

11. The semiconductor storage device according to claim 10, wherein
    the first memory elements have a storage layer with a first height dimension, and
    the second memory elements have a storage layer with a second height dimension that is greater than the first height dimension.

12. The semiconductor storage device according to claim 10, wherein
    the first memory elements have a storage layer with a first diameter, and
    the second memory elements have a storage layer with a second diameter that is greater than the first diameter.

13. The semiconductor storage device claim 8, wherein a logic circuit is provided in the first region.

14. The semiconductor storage device according claim 8, wherein
    the first region is on a first chip,
    the second region is on a second chip, and
    the first and second chips are stacked one on each other and electrically connected.

15. The semiconductor storage device according to claim 8, further comprising:
    a first chip including the first region and the second region; and
    a second chip in which the controller is disposed, wherein
    the first chip and the second chip are stacked one on the other and electrically connected to each other.

16. The semiconductor storage device according to claim 8, further comprising:
    a plurality of third memory elements in a third region, the third memory elements having a third writing speed that is slower than the second writing speed and a third data retention property that is longer than the second data retention property, wherein
    the controller is further configured write the data written to the plurality of second memory elements to the plurality of third memory elements after an elapse of a predetermined time since the writing of the data to the second memory elements.

17. A semiconductor storage device, comprising:
a plurality of first memory elements in a first region, the first memory elements having a first writing speed and a first data retention property;
a plurality of second memory elements in a second region, the second memory elements having a second writing speed that is slower than the first writing speed and a second data retention property that is longer than the first data retention property;
a plurality of third memory elements in a third region, the third memory elements having a third writing speed that is slower than the second writing speed and a third data retention property that is longer than the second data retention property; and
a controller configured to write data to the plurality of first memory elements and then write the data written to plurality of first memory elements to the plurality of second memory elements after an elapse of a first predetermined time since the writing of the data to the first memory elements, and then write the data written to the plurality of second memory elements to the plurality of third memory elements after an elapse of a second predetermined time since the writing of the data to the second memory elements.

18. The semiconductor device according to claim 17, wherein the first, second, and third memory elements are magnetic tunnel junction (MTJ) memory cells.

19. The semiconductor storage device according to claim 17, wherein the first memory elements and the second memory elements are variable resistance elements.

* * * * *